United States Patent [19]

Takeuchi et al.

[11] Patent Number: 5,777,900
[45] Date of Patent: Jul. 7, 1998

[54] FILTERING PROCESSOR AND FILTER METHOD

[75] Inventors: Seiichi Takeuchi, Neyagawa; Shinya Kadono, Kobe, both of Japan

[73] Assignee: Matsushita Electric Industrial Co., Ltd., Osaka, Japan

[21] Appl. No.: 401,363

[22] Filed: Mar. 9, 1995

[30] Foreign Application Priority Data

Mar. 10, 1994 [JP] Japan .................. 6-039745

[51] Int. Cl.[6] .......................... H04N 17/00; H04N 19/00
[52] U.S. Cl. .......................... 364/572; 364/724.011
[58] Field of Search .......................... 348/390, 397, 348/403, 404; 341/51, 61; 370/123, 72; 358/428, 430, 432; 364/724.1, 724.16, 724.01, 724.17, 572, 715.02

[56] References Cited

U.S. PATENT DOCUMENTS 5,537,493  7/1996  Wilkinson .

FOREIGN PATENT DOCUMENTS 6-338760  12/1994  Japan .
6-338761  12/1994  Japan .

*Primary Examiner*—Emanuel T. Voeltz
*Assistant Examiner*—Tony M. Cole
*Attorney, Agent, or Firm*—Ratner & Prestia

[57] ABSTRACT

A filtering processor for performing filtering by use of an N-tap filter (N is a natural number) of this invention includes: means for transforming a first signal series having $M_1$ signals ($M_1$ is a natural number) into a second signal series having $M_2$ signals ($M_2$ is a natural number); and means for performing filtering on the second signal series to generate a third signal series having $M_3$ signals ($M_3$ is a natural number), wherein the second signal series is composed of the first signal series and signals of a predetermined value added to precede the start and follow the end thereof, and $M_1$ signals among the $M_3$ signals included in the third signal series is independent.

46 Claims, 12 Drawing Sheets

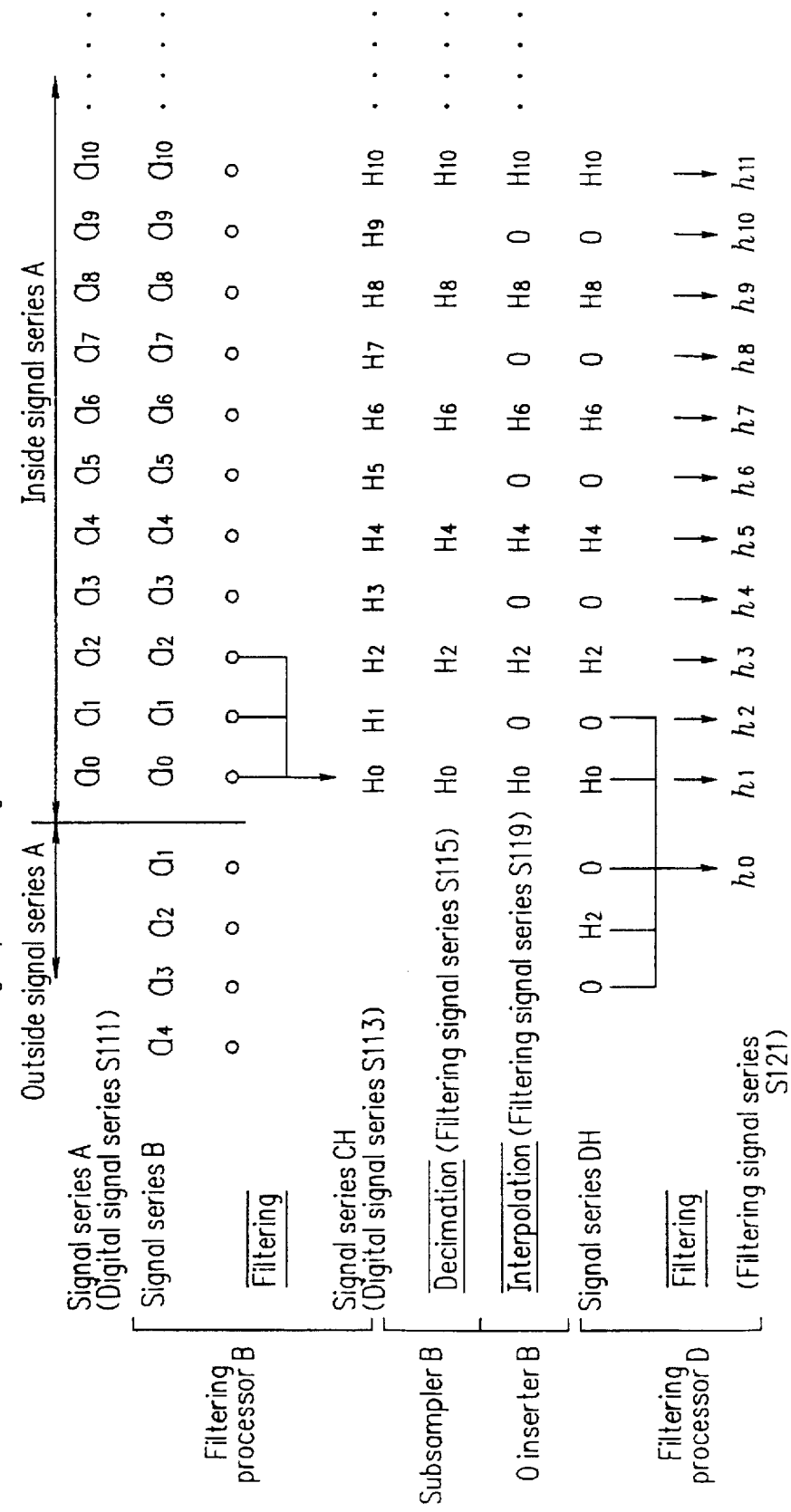

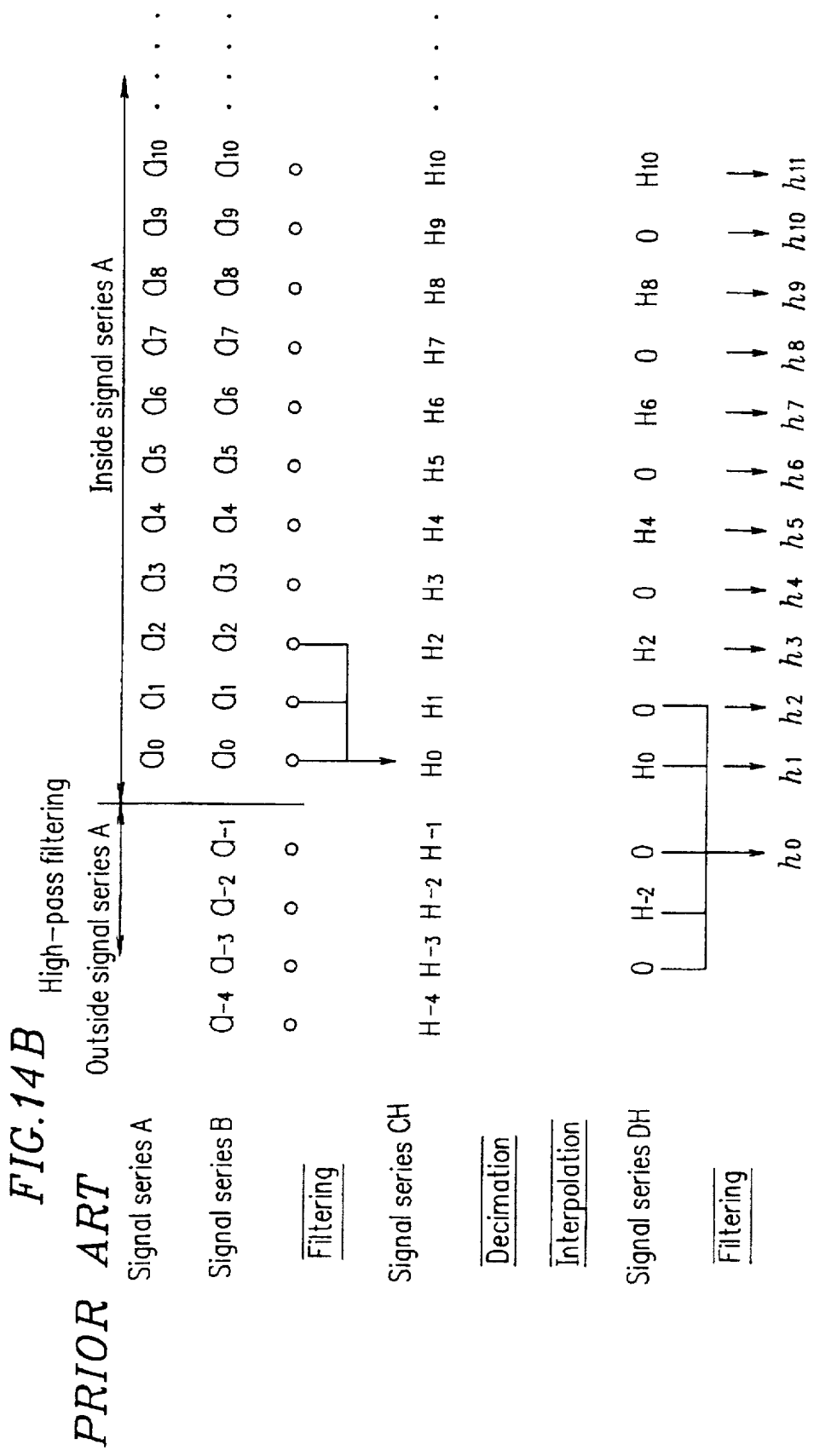

FILTERING PROCESSOR AND FILTER METHOD

BACKGROUND OF THE INVENTION

1. Field of the Invention

The present invention relates to a filtering processor and a filtering method. More specifically, the present invention relates to a filtering processor and a filtering method for performing frequency separation and eliminating a frequency band.

2. Description of the Related Art

In recent years, digital signal processing has been utilized in various technical fields. For example, a digital signal series having sample data obtained by sampling and quantizing video signals is subjected to high efficiency coding techniques where filtering and data compression are employed. Among high efficiency coding techniques, "subband coding" and "wavelet transformation coding", where a digital signal series is subjected to frequency separation filtering are known as highly effective coding techniques.

A digital signal series to be processed by such digital signal processing techniques has a finite length, giving rise to discontinuity of data at the start and the end of the series. Consequently, the filtering of such a digital signal series, data samples required for the filtering are not obtained at the start and the end of the digital signal series. For this reason, in order to frequency separate and frequency merge the digital signal series by filtering, certain values of data samples must be added to precede the start of and follow the end of the original digital signal series.

Referring to FIGS. 14A and 14B, a conventional filtering process using a frequency separation filter and a frequency merging filter will be described. Hereinbelow, the case of a one-dimensional filtering operation will be described. Filtering for a two-dimensional digital signal series such as video signals can be realized by performing two one-dimensional filtering operations; one in the horizontal and one in the vertical directions.

First, the frequency, separation processing will be described. The frequency separation is realized by filtering a digital signal series using a low-pass filter (for extracting low-frequency components of the signal series) and a high-pass filter (for extracting high-frequency components of the signal series).

For example, a digital signal series $A=\{a_0, a_1, \ldots, a_i, \ldots a_{(M-1)}\}$ having M data samples (M is a natural number) is subjected to filtering using a FIR (finite impulse response) type low-pass filter having NL taps and a FIR type high-pass filter having NH taps (NL and NH are natural numbers) in the following manner:

One output data sample to be obtained by the FIR filtering can be represented as a sum of values obtained by multiplying each of the corresponding NL or NH data samples by a predetermined coefficient.

Both the low-pass filter and the high-pass filter output M data samples. This means that the total number of output data samples is double the number of input data samples. A signal series output from the low-pass filter has signal components in the low-frequency half of the transmission band, while a signal series output from the high-pass filter has signal components in the high-frequency half of the transmission band. Therefore, ideally, even if each of the two output signal series is decimated by eliminating every other sample in order to obtain one-half the number of samples, information of the input digital signal series will not be lost. In the frequency separation processing, therefore, each of the signal series output from the low-pass filter and the high-pass filter is decimated by eliminating every other sample, so as to generate a signal series of low-frequency components and a signal series of high-frequency components both having a frequency band half that of the input digital signal series. Thus, the two signal series generated after the frequency separation processing preserve the information of the input signal series, and ideally, the total number of samples included in the two output signal series is M, which is the number of samples included in the input digital signal series.

Next, the frequency merging processing which is the inverse of the frequency separation processing will be described. In this process, the input digital signal series is restored from the two signal series generated by the frequency separation described above. First, the number of samples included in the respective frequency separated signal series should be increased in order to restore the pre-decimation M samples. For this purpose, in each of the signal series of low-frequency components and high-frequency components, samples with a value of 0 are interpolated at positions where samples were eliminated at decimation, so as to generate a new signal series. The interpolated signal series includes unnecessary components (aliasing components) generated by the decimation. Such components should be removed by filtering. A 0-interpolated low-frequency signal series (DL) and a 0-interpolated high-frequency signal series (DH) are subjected to filtering using a low-pass filter and a high-pass filter, respectively, so as to generate low-frequency components ($l_i$) and high-frequency components ($h_i$) of the input digital signal series. By merging components $l_i$ and $h_i$, the digital signal series A before the frequency separation is restored.

In the above conventional processing, however, the input digital signal series A is not completely restored if each of the signal series (DL and DH) to be subjected to filtering for the frequency merging has just M data samples. At the filtering operation, in general, in order to obtain a filtering-operated output data sample, an input data sample corresponding to the output data sample and a plurality of input data samples preceding and succeeding the input data sample corresponding to the number of taps are required. Accordingly, data samples required for the filtering of the samples positioned at the start and the end of the digital signal series are not obtained if the signal series DL or DH has just M data samples. In order to solve this problem, at the filtering of an input signal series, a required number of new data samples are added (or presumed) to precede the start of and follow the end of the input signal series. Thus, the number of samples included in the signal series after the 0 interpolation exceeds M.

The above processing will be further described in detail, taking as an example the case of using a FIR type symmetric short Kernel filter (SSKF).

A low-pass filter having five taps and a high-pass filter having three taps are used as the frequency separation filters. A low-pass filter having three taps and a high-pass filter having five taps are used as the frequency merging filter.

The coefficients for these filters are as shown in Table 1.

TABLE 1

| low-pass filter | | high-pass filter | |
|---|---|---|---|
| The frequency separation filters | | | |
| Ld0 | −0.125 | Hd0 | |
| Ld1 | 0.25 | Hd1 | |
| Ld2 | 0.75 | Hd2 | 0.5 |
| Ld3 | 0.25 | Hd3 | −1.0 |
| Ld4 | −0.125 | Hd4 | 0.5 |
| The frequency merging filters | | | |
| Ls0 | | Hs0 | 0.125 |
| Ls1 | | Hs1 | 0.25 |
| Ls2 | 0.5 | Hs2 | 0.75 |
| Ls3 | 1.0 | Hs3 | 0.25 |
| Ls4 | 0.5 | Hs4 | 0.125 |

Referring to FIG. 14A, a conventional filtering process of the finite-length digital signal series A (for example, a one-dimensional signal series obtained by taking one horizontal row of samples from second-dimensional image data) by use of the 5-tap low-pass filter will be described.

Data samples of a predetermined value (for example, 0) are added to precede the start of and follow the end of the input finite-length digital signal series A, so as to generate a new signal series B.

The data sample $L_i$ of a signal series CL output from the 5-tap low-pass filter is obtained by calculating the equation (1) below using data samples $\{a_{(i-2)}, a_{(i-1)}, a_i, a_{(i+1)}, a_{(i+2)}\}$ of the signal series B.

$$L_i = Ld0 \times a_{(i-2)} + Ld1 \times a_{(i-1)} + Ld2 \times a_i + Ld3 \times a_{(i+1)} + Ld4 \times a_{(i+2)} \quad (1)$$

By the above filtering represented by equation (1) on the signal series B, the signal series CL $\{L_0, L_1, L_2, \ldots, L_{(M-1)}\}$ corresponding to all the samples of the digital signal series A $\{a_0, a_1, \ldots, a_{(M-1)}\}$ including those at the start and the end thereof is obtained. The M data samples included in the signal series CL are independent of one another.

Similarly, referring to FIG. 14B, a conventional filtering process of the finite-length digital signal series A by use of the 3-tap high-pass filter will be described.

Data samples of a predetermined value (for example, 0) are added to precede the start of and follow the end of the input finite-length digital signal series A, so as to generate a new signal series B.

The data sample $H_i$ of a signal series CH output from the 3-tap high-pass filter is obtained by calculating equation (2) below using data samples $\{a_i, a_{(i+1)}, a_{(i+2)}\}$ of the signal series B.

$$H_i = Hd2 \times a_i + Hd3 \times a_{(i+1)} + Hd4 \times a_{(i+2)} \quad (2)$$

By the above filtering represented by equation (2) on the signal series B, the signal series CH $\{H_0, H_1, H_2, \ldots, H_{(M-1)}\}$ corresponding to all the samples of the digital signal series A $\{a_0, a_1, \ldots, a_{(M-1)}\}$ including those at the start and the end thereof is obtained. The M data samples included in the signal series CH are independent of one another.

Each of the above signal series CL and CH are then decimated and output as the frequency-separated signal series. In general, when a signal series subjected to the SSKF filtering is decimated, data samples at positions determined by the filter properties are eliminated. In the illustrated case, data samples in the odd numbers are eliminated, while data samples in the even numbers are retained in both signal series from the low-pass filter and the high-pass filter. Accordingly, the frequency-separated output in this case includes a signal series having low-frequency components $\{L_0, L_2, L_4, \ldots\}$ and a signal series having high-frequency components $\{H_0, H_2, H_4, \ldots\}$.

The thus frequency-separated signal series are then required to be frequency-merged so as to completely restore the digital signal series A.

Next, the frequency merging processing will be described in detail.

Referring to FIG. 14A, the signal series DL is generated by interpolating zeros in the decimated signal series having low-frequency components. The signal series DL is subjected to filtering using the low-pass filter, so as to obtain the data sample $l_i$ represented by equation (3):

$$l_i = Ls2 \times L_{(i-3)} + Ls3 \times L_{(i-2)} + Ls4 \times L_{(i-1)} \quad (3)$$

Similarly, the signal series DH generated by interpolating zeros in the decimated signal series having high-frequency components is subjected to filtering using the high-pass filter, so as to output a data sample $h_i$ represented by equation (4):

$$h_i = Hs0 \times H_{(i-3)} + Hs1 \times H_{(i-2)} + Hs2 \times H_{(i-1)} + Hs3 \times H_i + Hs4 \times H_{(i+1)} \quad (4)$$

$a'_i$ is obtained by equation (5):

$$a'_i = (l_i + h_i)/2 \quad (5)$$

where $a'_i = a_i$.

As a result, the digital signal series A can be correctly restored.

As is apparent from FIG. 14A, a sample $L_{-2}$ is required to obtain samples $l_0$ and $l_1$. Similarly, as is apparent from FIG. 14B, a sample $H_{-2}$ is required to obtain samples $h_0$ and $h_1$. Accordingly, at the transmission of the signal series having low-frequency components and the signal series having high-frequency components, the samples $L_{-2}$ and $H_{-2}$ must be transmitted together with the data samples corresponding to the digital signal series A. Otherwise, all of the data samples included in the digital signal series A will not be correctly restored. Thus, in the conventional process, excessive data must be transmitted, thus lowering the transmission efficiency.

In the video coding, data compression can be realized by adopting the variable length coding where a shorter code is allocated for frequently appearing data while a longer code is allocated for less frequently appearing data, based on the statistical deviation of high-frequency component data appearing less frequently. Further, since high-frequency component data is less perceptible to human eyes, the degradation in the image quality is less visible even when coarser quantization steps are adopted. Utilizing this property, the quantization level may be changed depending on the frequency components of the signal (adaptive quantization), so as to realize the data compression. Accordingly, the total amount of codes (data transmission amount) can be significantly reduced by adopting the combination of the adaptive quantization and the variable length coding in the frequency separation processing. A high efficiency coding unit realizes the above combined functions, and a decoding unit performs the inverse transformation. However, even though the data amount is reduced at the stage of coding by use of such a high efficiency coding unit, the problem of reduction of transmittance efficiency still exists insofar as the conventional filtering process is adopted in frequency separation and frequency merging.

SUMMARY OF THE INVENTION

The computer implemented filtering processor of this invention, includes transformation means for transforming a first signal series $\{a_0, a_1, \ldots, a_i, \ldots, a_{(M-1)}\}$ having M signals (M is a natural number and $M^3$ N) into a second signal series $\{b_{-K}, \ldots, b_{-1}, b_0, b_1, \ldots, b_{M-1}, b_M, \ldots, b_{M+K-1}\}$ having (M+2K) signals; and an N-tap filter (N is a natural number) for filtering the second signal series, wherein the transformation means transforms the first signal series into the second signal series based on equations:

$b_i = a_{-i}$ (when $-K \leq i < 0$)

$b_i = a_i$ (when $0 \leq i < M$)

$b_i = a_{2M-i-2}$ (when $M \leq i \leq M+K-1$)

where i is an integer, and K is a natural number; K=N/2 when N is an even number, and K=(N−1)/2 when N is an odd number.

Alternatively, the computer implemented filtering processor of this invention includes: transformation means for transforming a first signal series $\{a_0, a_1, \ldots, a_i, \ldots, a_{(M-1)}\}$ having M signals (M is a natural number and $M^3$ N) into a second signal series $\{b_{-K}, \ldots, b_{-1}, b_0, b_1, \ldots, b_{M-1}, b_M, \ldots, b_{M+K-1}\}$ having (M+2K) signals; and an N-tap filter (N is a natural number) for filtering the second signal series, wherein the transformation means transforms the first signal series into the second signal series based on equations:

$b_i = a_{-i-1}$ (when $-K \leq i < 0$)

$b_i = a_i$ (when $0 \leq i < M$)

$b_i = a_{2M-i-1}$ (when $M \leq i \leq M+K-1$)

where i is an integer, and K is a natural number; K=N/2 when N is an even number, and K=(N−1)/2 when N is an odd number.

Alternatively, the computer implemented filtering processor of this invention includes: transformation means for transforming a first signal series $\{a_0, a_1, \ldots, a_i, \ldots, a_{(M-1)}\}$ having M signals (M is a natural number and $M^3$ N) into a second signal series $\{b_{-K}, \ldots, b_{-1}, b_0, b_1, \ldots, b_{M-1}, b_M, \ldots, b_{M+K-1}\}$ having (M+2K) signals; and an N-tap filter (N is a natural number) for filtering the second signal series, wherein the transformation means transforms the first signal series into the second signal series based on equations:

$b_i = -a_{-i-1}$ (when $-K \leq i < 0$)

$b_i = a_i$ (when $0 \leq i < M$)

$b_i = -a_{2M-i-1}$ (when $M \leq i \leq M+K-1$)

where i is an integer, and K is a natural number; K=N/2 when N is an even number, and K=(N−1)/2 when N is an odd number.

In one embodiment, the filtering processor further includes filter coefficient flag inversion means for inverting a flag of a filter coefficient of the filter in accordance with a predetermined rule.

In another embodiment, the filtering processor further includes flag inversion means for inverting a flag of a data sample of the second signal series in accordance with a predetermined rule.

In still another embodiment, the filtering processor further includes determination means for determining the number of taps and the filter coefficient of the filter depending on the first signal series.

In still another embodiment, the filtering processor further includes determination means for determining the number of taps and the filter coefficient of the filter so that the number of taps of the filter is smaller than the number of signals included in the first signal series.

In another embodiment, the filtering processor includes: memory means for storing a first signal series input thereinto; position determination means for determining the position of a next signal in a second signal series, the next signal being output next from the memory means; and address generation means for generating an address of the next signal in the memory means, so as to output the address to the memory means.

In still another embodiment, the filtering processor includes: memory means for storing a first signal series input thereinto; position determination means for determining the position of a next signal in a second signal series, the next signal being output next from the memory means; address generation means for generating an address of the next signal in the memory means so as to output the address to the memory means, and for outputting a flat inversion signal indicating whether or not the flag of the next signal should be inverted; and flag inversion means for inverting the flag of the next signal output from the memory means based on the flag inversion signal.

In still another aspect of the present invention, the computer implemented filtering processor includes: means for transforming a first signal series having $M_1$ signals ($M_1$ is a natural number) into a second signal series having $M_2$ signals ($M_2$ is a natural number); and an N-tap filter for filtering the second signal series to generate a third signal series having $M_3$ signals ($M_3$ is a natural number), wherein the second signal series is composed of the first signal series and signals of a predetermined value added to precede the start and follow the end thereof, and $M_1$ signals among the $M_3$ signals included in the third signal series is independent.

In still another aspect of the present invention, a filtering method is provided. The method includes the steps of: using a computer to transform a first signal series $\{a_0, a_1, \ldots, a_i, \ldots, a_{(M-1)}\}$ having M signals (M is a natural number and $M^3$ N) into a second signal series $\{b_{-K}, \ldots, b_{-1}, b_0, b_1, \ldots, b_{M-1}, b_M, \ldots, b_{M+K-1}\}$ having (M+2K) signals; and performing filtering for the second signal series by use of the filter, wherein the transformation the first signal series into the second signal series is based on equations:

$b_i = a_{-i}$ (when $-K \leq i < 0$)

$b_i = a_i$ (when $0 \leq i < M$)

$b_i = a_{2M-i-2}$ (when $M \leq i \leq M+K-1$)

where i is an integer, and K is a natural number; K=N/2 when N is an even number, and K=(N−1) /2 when N is an odd number; and using an N-tap filter (N is a natural number) to filter the second signal series.

Alternatively, the filtering method, includes the steps of: using a computer to transform a first signal series $\{a_0, a_1, \ldots, a_i, \ldots, a_{(M-1)}\}$ having M signals (M is a natural number and $M^3$ N) into a second signal series $\{b_{-K}, \ldots, b_{-1}, b_0, b_1, \ldots, b_{M-1}, b_M, \ldots, b_{M+K-1}\}$ having (M+2K) signals, wherein the transformation of the first signal series into the second signal series is based on equations:

$b_i = a_{-i-1}$ (when $-K \leq i < 0$)

$b_i = a_i$ (when $0 \leq i < M$)

$b_i = a_{2M-i-1}$ (when $M \leq i \leq M+K-1$)

where i is an integer, and K is a natural number; K=N/2 when N is an even number, and K=(N−1)/2 when N is an odd number; and using an N-tap filter (N is a natural number) to filter the second signal series.

Alternatively, the filtering method, includes the steps of: using a computer to transform a first signal series {$a_0$, $a_1$, ..., $a_i$, ..., $a_{(M−1)}$} having M signals (M is a natural number and $M^3$ N) into a second signal series {$b_{−K}$, ..., $b_{−1}$, $b_0$, $b_1$, ..., $b_{M−1}$, $b_M$, ..., $b_{M+K−1}$} having (M+2K) signals, wherein the transformation of the first signal series into the second signal series is based on equations:

$$b_i = -a_{-i-1} \text{ (when } -K \leq i < 0\text{)}$$

$$b_i = a_i \text{ (when } 0 \leq i < M\text{)}$$

$$b_i = -a_{2M-i-1} \text{ (when } M \leq i \leq M+K-1\text{)}$$

where i is an integer, and K is a natural number; K=N/2 when N is an even number, and K=(N−1)/2 when N is an odd number; and using an N-tap filter (N is natural number) to filter the second signal series.

In one embodiment, the method further includes the step of inverting a flag of a filter coefficient of the filter in accordance with a predetermined rule.

In another embodiment, the method further includes the step of inverting a data sample of the second signal series in accordance with a predetermined rule.

In still another embodiment, the method further includes the step of determining the number of taps and the filter coefficient of the filter depending on the first signal series.

In still another embodiment, the method further includes the step of determining the number of taps and the filter coefficient of the filter so that the number of taps of the filter is smaller than the number of signals included in the first signal series.

Thus, the invention described herein makes possible the advantages of: (1) providing a filtering processor and a filtering method capable of reducing the number of independent data samples after the filtering; (2) providing a video signal coding apparatus capable of supplying a highly efficient video signal coding especially when the coding is performed per area; (3) providing a video signal decoding apparatus capable of decoding coded signal series.

These and other advantages of the present invention will become apparent to those skilled in the art upon reading and understanding the following detailed description with reference to the accompanying figures.

BRIEF DESCRIPTION OF THE DRAWINGS

FIGS. 13A and 13B illustrate the filtering method including data compression and expansion according to the present invention performed using one of the filtering processors of the first to fifth examples.

FIGS. 14A and 14B illustrate a conventional filtering method.

DESCRIPTION OF THE PREFERRED EMBODIMENTS

EXAMPLE 1

A first example of the filtering processor according to the present invention will be described with reference to FIG. 1.

In this example, a one-dimensional filtering operation will be described. Two-dimensional filtering can be realized by performing two one-dimensional filtering operations; in horizontal and vertical directions. Thus, the present invention is applicable to multi-dimensional filtering.

Figure 1:
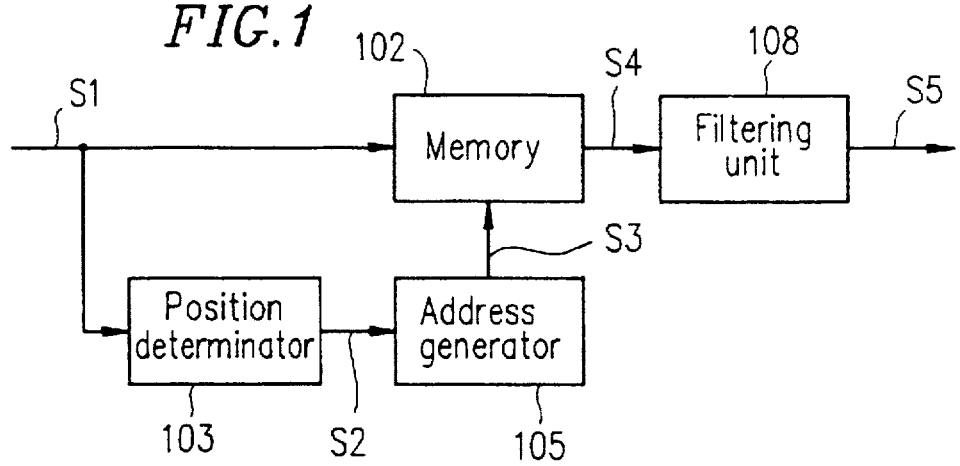
FIG. 1 is a block diagram showing the configuration of a first example and a second example of the filtering processor according to the present invention.

FIG. 1 is a block diagram showing the configuration of the filtering processor of the first example. The filtering processor includes a memory 102, a position determinator 103, an address generator 105, and a filtering unit 108. The reference code s1 denotes an input digital signal series, s2 a positional information signal generated by the position determinator 103, s3 an address signal generated by the address generator 105, s4 a digital signal series output from the memory 102, and s5 a filtering signal series subjected to filtering by the filtering unit 108.

The operation of the filtering processor with the above configuration will be described.

The position determinator 103 determines where the data sample presently under processing is positioned in the input digital signal series s1 and outputs the resultant positional information as the positional information signal s2. The address generator 105 generates the address signal s3 based on the positional information signal s2 and outputs the address signal s3 to the memory 102 so that the signal series to be subjected to filtering by the filtering unit 108 can be output from the memory 102. The memory 102 stores the input digital signal series s1 and outputs the signal series designated by the address signal s3 as the digital signal series s4. The filtering unit 108 performs the filtering of the digital signal series s4 with a predetermined filter and outputs the resultant filtering signal series s5.

Figure 10:
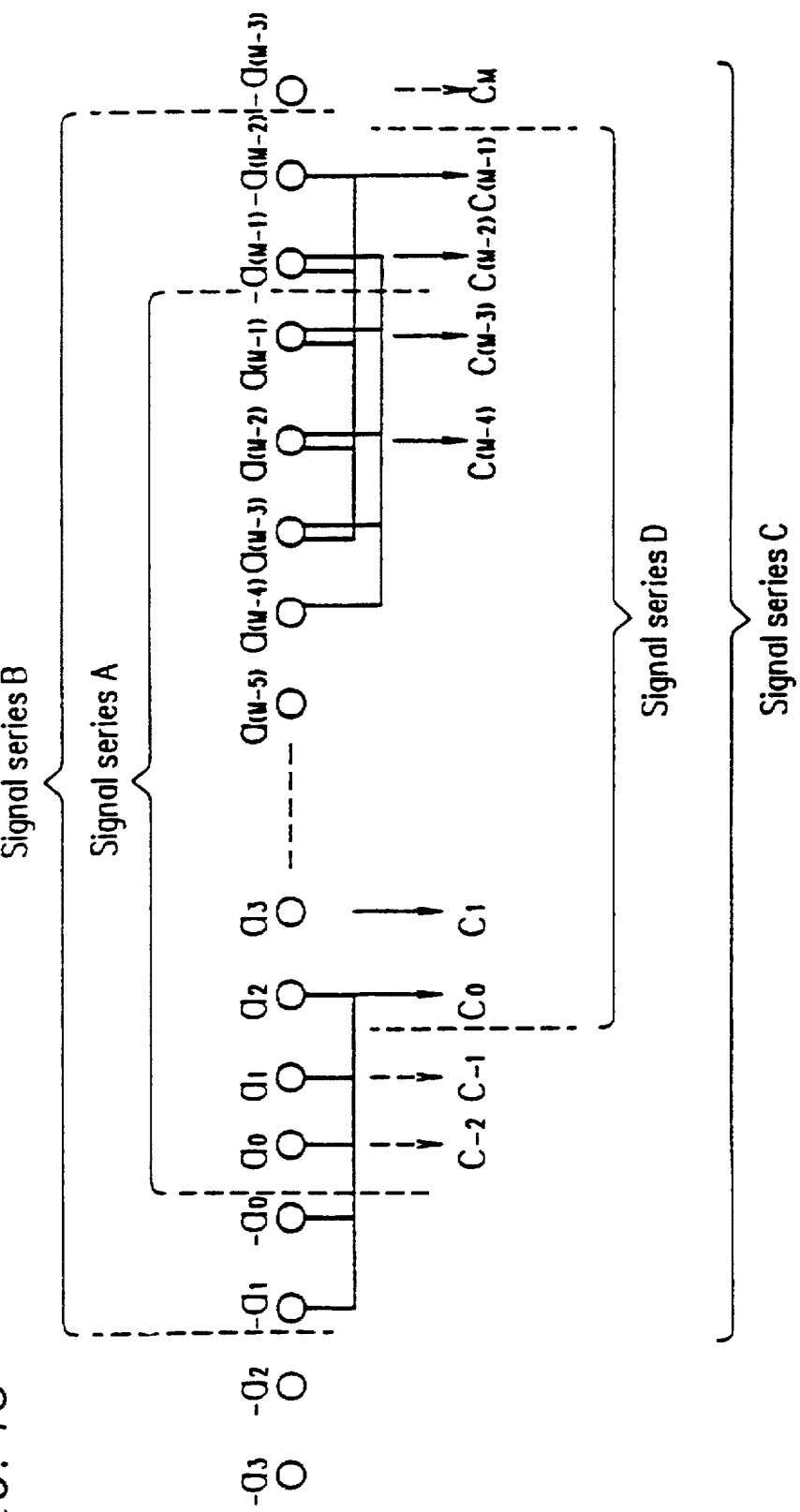

The operation of the filtering processor will be described more specifically with reference to FIG. 10A. As the input digital signal series s1, an input digital signal series A={$a_0$, $a_1$, ..., $a_i$, ..., $a_{(M−1)}$} having M data samples is input into the memory 102 and stored therein. The input digital signal series A is also input into the position determinator 103. The position determinator 103 determines where the data sample $a_i$ presently input is positioned in the input digital signal series A and outputs the determination result as the positional information signal s2 to the address generator 105. On receipt of the positional information signal s2, the address generator 105 outputs the address signal s3 to the memory 102 so that a digital signal series B can be output from the memory 102. The memory 102 selects data samples to be output based on the address signal s3 and outputs data samples of the digital signal series B sequentially as the digital signal series s4.

In the case where N-tap filtering is performed for the input digital signal series A={$a_0, a_1, \ldots, a_i, \ldots, a_{(M-1)}$} having M data samples (M and N are natural numbers, and i is an integer; N is equal to or less than M), the digital signal series B is obtained by transforming the digital signal series A as follows:

$b_i = a_{-i}$ (when $-K \leq i < 0$)

$b_i = a_i$ (when $0 \leq i < M$)

$b_i = a_{2M-i-2}$ (when $M \leq i \leq M+K-1$)

where K is a natural number; K=N/2 when N is an even number, and K=(N−1)/2 when N is an odd number.

As a result of the above transformation, the digital signal series B={$a_K, \ldots, a_1, a_0, a_1, \ldots, a_{M-1}, a_{M-2}, \ldots, a_{M-(K-1)}$} is generated.

The digital signal series B obtained by the above transformation is subjected to filtering by the filtering unit 108 so as to generate a digital signal series C. In the case where 5-tap filtering (N=5) is performed, a data sample $c_i$ in the digital signal series C is obtained by a calculation using five data samples ($b_{(i-2)}, b_{(i-1)}, b_i, b_{(i+1)}, b_{(i+2)}$) of the digital signal series B. The resultant digital signal series C includes {$c_{-2}, c_{-1}, c_0, c_1, c_2, \ldots, c_{(M-3)}, c_{(M-2)}, c_{(M-1)}, c_M$}. If the filter coefficient H={$h_0, h_1, h_2, h_3, h_4$} of the filtering unit 108 is symmetrical, i.e., when $h_0=h_4$ and $h_1=h_3$, the relationships of $c_{-2}=c_2$, $c_{-1}=c_1$, and $c_M=c_{(M-2)}$ are established in the digital signal series C. In this case, the number of independent data samples included in the digital signal series C is M. Thus, it is possible to select only these M independent data samples from the digital signal series C as a digital signal series D and output it from the filtering unit 108 as the filtering signal series s5. In this example, the data samples $C_{-2}, C_{-1}, c_M$ are deleted as in the above case. Thus, the number of data samples to be transmitted can be reduced.

As described above, the filtering processor of this example including the position determinator 103, the address generator 105, the memory 102, and the filtering unit 108 effectively reduces the number of independent data samples after the filtering, compared with the conventional filtering processors. This improves the efficiency of the transmission of a digital signal series.

In this example, when the filtering is performed for the frequency merging, the digital signal series DL or DH is used as the input digital signal series s1.

EXAMPLE 2

A second example of the filtering processor according to the present invention will be described.

In this example, a one-dimensional filtering operation will be described. Two-dimensional filtering can be realized by performing two one-dimensional filtering operations; one in the horizontal and one in the vertical directions. Thus, the present invention is applicable to multi-dimensional filtering.

The filtering processor of this example uses filter coefficients different from those used in Example 1, but is based on the same concept as that of Example 1. The configuration of the filtering processor of Example 2 is therefore the same as that of Example 1.

The operation of the filtering processor of this example will be described more specifically with reference to FIG. 10B. As the input digital signal series s1, an input digital signal series A={$a_0, a_1, \ldots, a_i, \ldots, a_{(M-1)}$} having M data samples is input into the memory 102 and stored therein. The input digital signal series A is also input into the position determinator 103. The position determinator 103 determines where the data sample $a_i$ presently input is positioned in the input digital signal series A and outputs the determination result as the positional information signal s2 to the address generator 105. On receipt of the positional information signal s2, the address generator 105 outputs the address signal s3 to the memory 102 so that a digital signal series B can be output from the memory 102. The memory 102 selects data samples to be output according to the address signal s3, and outputs data samples of the digital signal series B sequentially as the digital signal series s4. The operation of the filtering processor of this example is different from that of Example 1 in that the address generator 105 generates the address signal s3 including certain information so that the substantial transformation operation between the input digital signal series A and the digital signal series B output from the memory 102 is different from that in Example 1.

In the case where N-tap filtering is performed for the input digital signal series A={$a_0, a_1, \ldots, a_i, \ldots, a_{(M-1)}$} having M data samples (M and N are natural numbers, and i is an integer; N is equal to or less than M), the digital signal series B is obtained by transforming the digital signal series A as follows:

$b_i = a_{-i-1}$ (when $-K \leq i < 0$)

$b_i = a_i$ (when $0 \leq i < M$)

$b_i = a_{2M-i-1}$ (when $M \leq i \leq M+K-1$)

where K is a natural number; K=N/2 when N is an even number, and K=(N−1)/2 when N is an odd number.

The operation of the N-tap filtering for the resultant digital signal series B is the same as that of Example 1.

As described above, the filtering processor of this example including the position determinator 103, the address generator 105, the memory 102, and the filtering unit 108 effectively reduces the number of independent data samples after the filtering, compared with the conventional filtering processors. This improves the efficiency of the transmission of a digital signal series.

In this example, when the filtering is performed for the frequency merging, the digital signal series DL or DH is used as the input digital signal series s1.

EXAMPLE 3

A third example of the filtering processor according to the present invention will be described with reference to FIG. 2.

In this example, a one-dimensional filtering operation will be described. Two-dimensional filtering can be realized by performing two one-dimensional filtering operations; one in the horizontal and one in the vertical directions. Thus, the present invention is applicable to multi-dimensional filtering.

Figure 2:
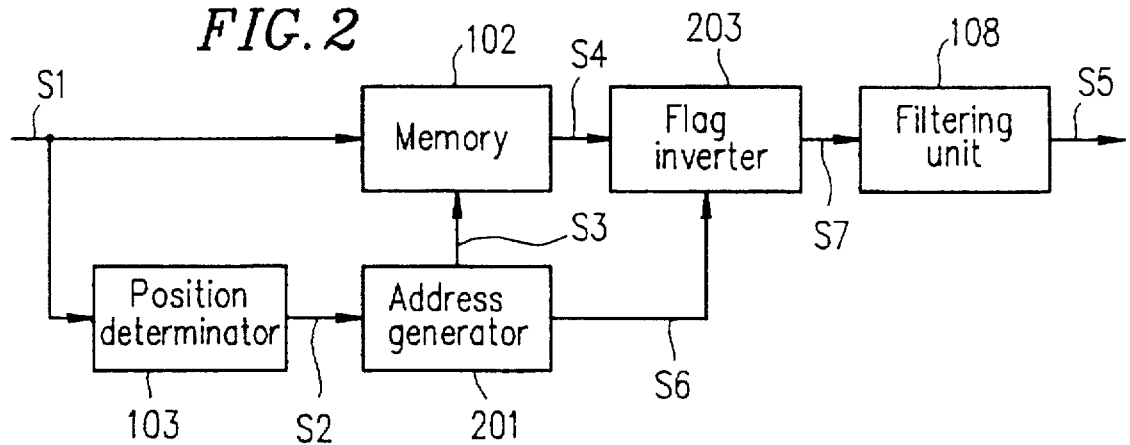
FIG. 2 is a block diagram showing the configuration of a third example of the filtering processor according to the present invention.

FIG. 2 is a block diagram showing the configuration of the filtering processor of the third example. The filtering processor includes a memory 102, a position determinator 103, an address generator 201, a flag inverter 203, and a filtering unit 108. The reference code s1 denotes an input digital signal series, s2 a positional information signal generated by the position determinator 103, s3 an address signal generated by the address generator 201, s4 a digital signal series output from the memory 102, s5 a filtering signal series subjected to filtering by the filtering unit 108, s6 a flag inversion signal generated by the address generator 201, and s7 a digital signal series generated by the flag inverter 203.

The operation of the filtering processor with the above configuration will be described.

The processing covering from the input of the input digital signal series s1 through the output of the positional information signal s2 from the position determinator 103 indicating the position determination result is the same as that described in Example 1. The description thereof is therefore omitted herein. The address generator 201 generates the address signal s3 based on the positional information signal s2 and outputs the address signal s3 to the memory 102 so that the signal series to be subjected to filtering by the filtering unit 108 can be output from the memory 102. The address generator 201 also outputs the flag inversion signal s6 indicating whether or not the flag of the digital signal series s4 output from the memory 102 should be inverted. The flag inverter 203 inverts the flag corresponding to the plus/minus code for only a signal series designated to invert the flag by the flag inversion signal s6 and outputs the result as the digital signal series s7. For example, the flag of 3 is inverted to output −3. The flag of −6 is inverted to output 6.

The operation of the filtering processor of this example will be described more specifically with reference to FIG. 10C. As the input digital signal series s1, an input digital signal series $A=\{a_0, a_1, \ldots, a_i, \ldots, a_{(M-1)}\}$ having M data samples is input into the memory 102 and stored therein. The input digital signal series A is also input into the position determinator 103. The position determinator 103 determines where the data sample $a_i$ presently input is positioned in the input digital signal series A and outputs the determination result as the positional information signal s2 to the address generator 201. On receipt of the positional information signal s2, the address generator 201 outputs the address signal s3 to the memory 102 so that the digital signal series s4 can be output from the memory 102. The address generator 201 also outputs the flag inversion signal s6 indicating whether or not the flag of the digital signal series s4 output from the memory 102 should be inverted. The memory 102 selects data samples to be output based on the address signal s3 and outputs data samples of the digital signal series B sequentially as the digital signal series s4. The flag inverter 203 inverts the flag of the digital signal series s4 based on the flag inversion signal s6. As a result, the digital signal series B is generated as the digital signal series s7.

In the case where N-tap filtering is performed for the digital signal series $A=\{a_0, a_1, \ldots, a_i, \ldots, a_{(M-1)}\}$ having M data samples (M and N are natural numbers, and i is an integer; N is equal to or less than M), the digital signal series B is obtained by transforming the digital signal series A as follows:

$b_i = -a_{-i-1}$ (when $-K \leq i < 0$)

$b_i = a_i$ (when $0 \leq i < M$)

$b_i = -a_{2M-i-1}$ (when $M \leq i \leq M+K-1$)

where K is a natural number; K=N/2 when N is an even number, and K=(N−1)/2 when N is an odd number.

As a result of the above transformation, the digital signal series $B=\{-a_{k-1}, \ldots, -a_1, -a_0, a_0, a_1, \ldots, a_{M-1}, -a_{M-1}, \ldots, -a_{M-K}\}$ is generated.

The digital signal series B obtained by the above transformation is subjected to filtering by the filtering unit 108 so as to generate a digital signal series C. In the case where 5-tap filtering (N=5) is performed, a data sample $c_i$ in the digital signal series C is obtained by a calculation using five data samples $(b_{(i-2)}, b_{(i-1)}, b_i, b_{(i+1)}, b_{(i+2)})$ of the digital signal series B (i is an integer). The resultant digital signal series C includes $\{c_{-2}, c_{-1}, c_0, c_1, c_2, \ldots, c_{(M-3)}, c_{(M-2)}, c_{(M-1)}, c_M\}$. If the filter coefficient $H=\{h_0, h_1, h_2, h_3, h_4\}$ of the filtering unit 108 has the relationship of $h_0=h_4$, $h_1=h_3$, the number of independent data samples included in the digital signal series C is M, including $c_0, c_1, c_2, \ldots, c_{(M-3)}, c_{(M-2)}, c_{(M-1)}$ as already described in Example 1. Thus, it is possible to select only these M independent data samples from the digital signal series C as a digital signal series D and output it from the filtering unit 108 as the filtering signal series s5. In this example, the data samples $c_{-2}, c_{-1}, c_M$ are deleted as in the above case. Thus, the number of data samples to be transmitted can be reduced.

As described above, the filtering processor of this example including the memory 102, the position determinator 103, the address generator 201, the flag inverter 203, and the filtering unit 108 reduces the number of independent data samples after the filtering, more effectively when compared with the conventional filtering processors. This improves the efficiency of the transmission of a digital signal series.

In this example, when the filtering is performed for the frequency merging, the digital signal series DL or DH is used as the input digital signal series s1.

EXAMPLE 4

A fourth example of the filtering processor according to the present invention will be described with reference to FIG. 3.

In this example, a one-dimensional filtering operation will be described. Two-dimensional filtering can be realized by performing two one-dimensional filtering operations; one in the horizontal and one in the vertical directions. Thus, the present invention is applicable to multi-dimensional filtering.

Figure 3:
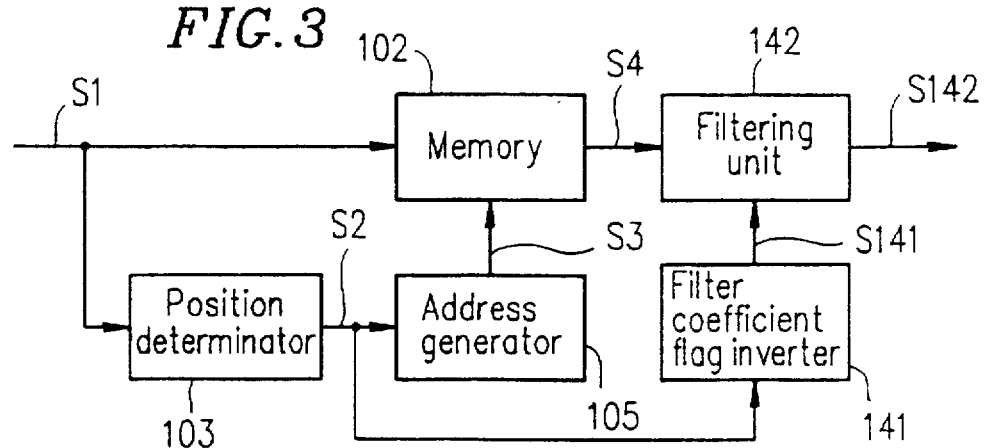
FIG. 3 is a block diagram showing the configuration of a fourth example of the filtering processor according to the present invention.

FIG. 3 is a block diagram showing the configuration of the filtering processor of the fourth example. The filtering processor includes a memory 102, a position determinator 103, an address generator 105, a filter coefficient flag inverter 141, and a filtering unit 142. The reference code s1 denotes an input digital signal series, s2 a positional information signal generated by the position determinator 103, s3 an address signal generated by the address generator 105, s4 a digital signal series output from the memory 102, s141 a filter coefficient flag inversion signal generated by the filter coefficient flag inverter 141, and s142 a filtering signal series subjected to filtering by the filtering unit 142.

The operation of the filtering processor with the above configuration will be described.

The processing covering from the input of the input digital signal series si into the memory 102 through the output of the digital signal series s4 is the same as that described in Example 1. The description thereof is therefore omitted herein. The filter coefficient flag inverter 141 outputs the filter coefficient flag inversion signal s141 indicating whether or not the flag of the filter coefficient for the filtering to be performed by the filtering unit 142 should be inverted. The filtering unit 142 inverts the flag corresponding to the plus/minus code for only a filter coefficient designated to invert the flag by the filter coefficient flag inversion signal s141, performs the filtering for the digital signal series s4 by use of the resultant filter coefficient, and outputs the result as the filtering signal series s142. The flag inversion as used herein means, for example, to output −3 when the flag of 3 is inverted, and output 6 when the flag of −6 is inverted.

Now, the flag inversion for the filter coefficient will be described.

In the case where N-tap filtering is performed for the digital signal series $A=\{a_0, a_1, \ldots, a_i, \ldots, a_{(M-1)}\}$ having M data samples (M and N are natural numbers, and i is an integer; N is equal to or less than M), the digital signal series B is obtained by transforming the digital signal series A as follows:

$b_i=a_{-i}$ (when $-K \leq i<0$)

$b_i=a_i$ (when $0 \leq i<M$)

$b_i=a_{2M-i-2}$ (when $M \leq i \leq M+K-1$)

where K is a natural number; $K=N/2$ when N is an even number, and $K=(N-1)/2$ when N is an odd number.

As a result of the above transformation, the digital signal series $B=\{a_k, \ldots, a_1, a_0, a_1, \ldots, a_{M-1}, a_{M-2}, \ldots, -a_{M-k-1}\}$ is generated.

The digital signal series B obtained by the above transformation is subjected to filtering by the filtering unit 142 so as to generate a digital signal series C. In the case where 5-tap filtering (N=5) is performed, a data sample $c_i$ in the digital signal series C is obtained by a calculation using five data samples ($b_{(i-2)}$, $b_{(i-1)}$, $b_i$, $b_{(i+1)}$, $b_{(i+2)}$) of the digital signal series B (i is an integer). The resultant digital signal series C includes $\{c_{-2}, c_{-1}, c_0, c_1, c_2, \ldots, c_{(M-3)}, c_{(M-2)}, c_{(M-1)}, c_M\}$. In this example, the filter coefficient $H=\{h_0, h_1, h_2, h_3, h_4\}$ of the filtering unit 142 has the relationship of $h_0=-h_4$, $h_1=-h_3$. At the calculation of the data samples $c_{-2}$, $c_{-1}$, $c_0$, and $c_1$, the filter coefficient is inverted based on the filter coefficient flag inversion signal s141 output from the filter coefficient flag inverter 141. As a result, $c_{-2}$, $c_{-1}$, $c_0$, and $c_1$ are calculated based on the following equations:

$c_{-2}=(-h_0) \times a_4+(-h_1) \times a_3+h_2 \times a_2+(-h_3) \times a_1+(-h_4) \times a_0$ $c_{-1}=(-h_0) \times a_3+(-h_1) \times a_2+h_2 \times a_1+(-h_3) \times a_0+h_4 \times a_1$ $c_0=(-h_0) \times a_2+(-h_1) \times a_1+h_2 \times a_0+h_3 \times a_1+h_4 \times a_2$ $c_1=(-h_0) \times a_1+h_1 \times a_0+h_2 \times a_1+h_3 \times a_2+h_4 \times a_3$ By the above calculation, the relationship of $c_{-2}=c_2$ and $c_{-1}=c_1$ is established, and thus the number of independent data samples included in the digital signal series C is M, including $c_0, c_1, c_2, \ldots, c_{(M-3)}, c_{(M-2)}, c_{(M-1)}$. Therefore, it is possible to select only those M independent data samples from the digital signal series C as a digital signal series D and output it from the filtering unit 142 as the filtering signal series s142. In this example, the data samples $c_{-2}$, $c_{-1}$, $c_M$ are deleted. Thus, the number of data samples to be transmitted can be reduced.

As described above, the filtering processor of this example including the memory 102, the position determinator 103, the address generator 105, the filter coefficient flag inverter 141, and the filtering unit 142 effectively reduces the number of independent data samples after the filtering, compared with the conventional filtering processors. This improves the efficiency of the transmission of a digital signal series.

The digital signal series B may also be obtained by transforming the digital signal series A as follows:

$b_i=a_{-i-1}$ (when $-K \leq i<0$)

$b_i=a_i$ (when $0 \leq i<M$)

$b_i=a_{2M-i-1}$ (when $M \leq i \leq M+K-1$)

where K is a natural number; $K=N/2$ when N is an even number, and $K=(N-1)/2$ when N is an odd number.

In the filtering processor of this example, the flag of the filtering coefficient was inverted. Instead, the flag of the sample data to be input may be inverted. In the latter case, $c_{-2}$, $c_{-1}$, $c_0$, and $c_1$ are calculated based on the following equations:

$c_{-2}=h_0 \times (-a_4)+h_1 \times (-a_3)+h_2 \times a_2+h_3 \times (-a_1)+h_4 \times (-a_0)$ $c_{-1}=h_0 \times (-a_3)+h_1 \times (-a_2)+h_2 \times a_1+h_3 \times (-a_0)+h_4 \times a_1$ $c_0=h_0 \times (-a_2)+h_1 \times (-a_1)+h_2 \times a_0+h_3 \times a_1+h_4 \times a_2$ $c_1=h_0 \times (-a_1)+h_1 \times a_0+h_2 \times a_1+h_3 \times a_2+h_4 \times a_3$ In this example, when the filtering is performed for the frequency merging, the digital signal series DL or DH is used as the input digital signal series s1.

EXAMPLE 5

A fifth example of the filtering processor according to the present invention will be described with reference to FIG. 4.

In this example, a one-dimensional filtering operation will be described. Two-dimensional filtering can be realized by performing two one-dimensional filtering operations; one in the horizontal and one in the vertical directions, and therefore, the description thereof is omitted.

Figure 4:
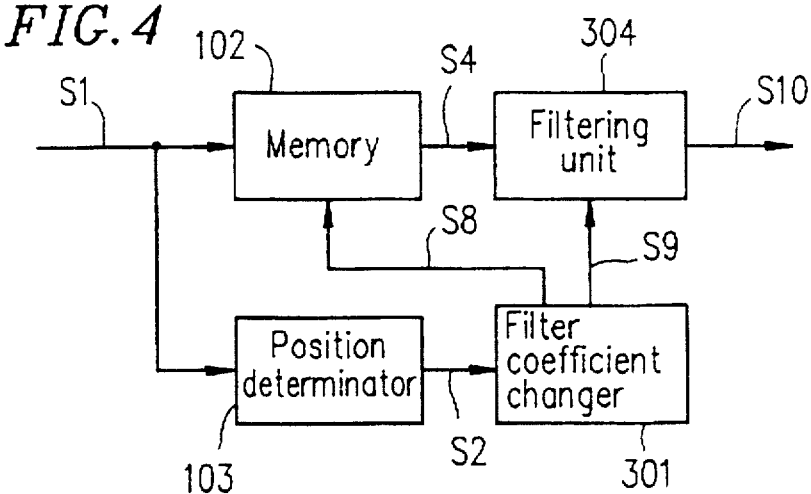
FIG. 4 is a block diagram showing the configuration of a fifth example of the filtering processor according to the present invention.

FIG. 4 is a block diagram showing the configuration of the filtering processor of the fifth example. The filtering processor of this example includes a memory 102, a position determinator 103, a filter coefficient changer 301, and a filtering unit 304. The reference code s1 denotes an input digital signal series, s2 a positional information signal generated by the position determinator 103, s4 a digital signal series output from the memory 102, s8 an address signal generated by the filter coefficient changer 301, s9 a filtering unit control signal generated by the filter coefficient changer 301, and s10 a filtering signal series subjected to filtering by the filtering unit 304. Since the basic concept of this example is the same as that of Example 1, only points different from Example 1 will be described below.

The operation of the filtering processor with the above configuration will be described.

The position determinator 103 determines where the data sample presently under processing is positioned in the input digital signal series s1, and outputs the resultant positional information as the positional information signal s2.

The filter coefficient changer 301 outputs the address signal s8 based on the number of data samples constituting the input digital signal series si and the positional information signal s2 so that a signal series to be subjected to filtering can be output from the memory 102. The filter coefficient changer 301 also outputs the filtering unit control signal s9 for determining the number of taps of a filter and the filter coefficient used in the filtering unit 304. The memory 102 stores the input digital signal series s1 and outputs the signal series designated by the address signal s8 as the digital signal series s4. The filtering unit 304 performs the filtering of the digital signal series s4 with a filter designated by the filtering unit control signal s9, and outputs the resultant filtering signal series s10.

Hereinbelow, the necessity of the filter coefficient change will be described.

When, for example, horizontal rows of samples are selected from two-dimensional image data one by one and each row is used as the input digital signal series s1, the number of samples included in the respective input digital signal series s1 input into the filtering processor are different from one another. In this case, if a 7-tap filter is used for the filtering of all of the digital signal series s1, there may arise the case where a signal series composed of five samples is subjected to the filtering with the 7-tap filter. In such a case, the transformation efficiency is reduced. In other words, it is more efficient to perform the filtering for the signal series composed of five samples using a filter with less taps. Accordingly, it is required to change the filter coefficient depending on the number of samples included in the respective input digital signal series.

As described above, the filtering processor of this example including the memory 102, the position determinator 103, the filter coefficient changer 301, and the filtering unit 304 effectively selects the filter depending on the number of samples included in the input digital signal series, and changes the number of taps of the filter and the filter coefficient. This reduces the number of independent data samples after the filtering, compared with the conventional filtering processors.

EXAMPLE 6

A sixth example of the filtering processor according to the present invention will be described with reference to FIG. 5.

In this example, a one-dimensional filtering operation will be described. Two-dimensional filtering can be realized by performing two one-dimensional filtering operations; one in the horizontal and one in the vertical directions. Thus, the present invention is applicable to multi-dimensional filtering.

Figure 5:
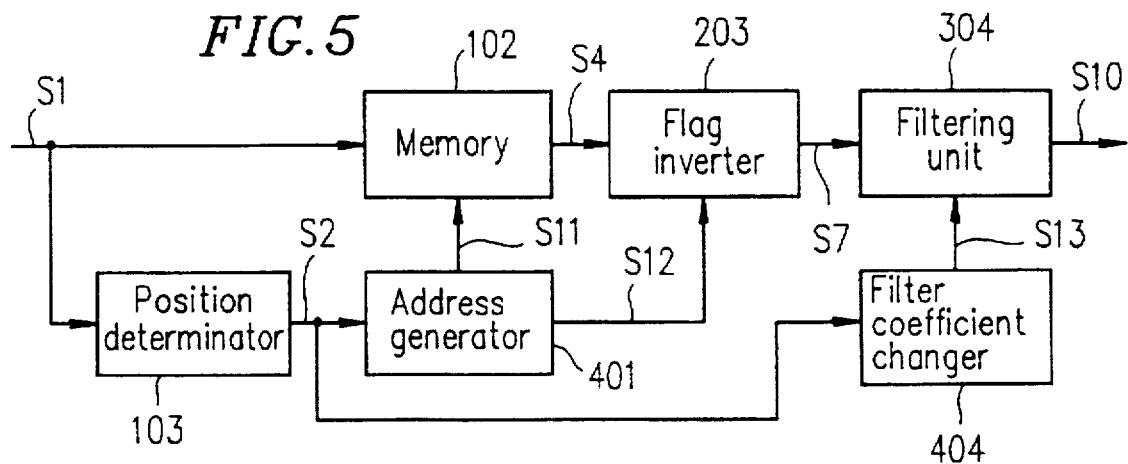
FIG. 5 is a block diagram showing the configuration of a filtering processor realized by combining the first to fifth examples.

FIG. 5 is a block diagram showing the configuration of the filtering processor of the sixth example. The filtering processor of this example includes a memory 102, a position determinator 103, an address generator 401, a flag inverter 203, a filter coefficient changer 404, and a filtering unit 304. The reference code s1 denotes an input digital signal series, s2 a positional information signal generated by the position determinator 103, s4 a digital signal series output from the memory 102, s7 a digital signal series generated by the flag inverter 203, s10 a filtering signal series subjected to filtering by the filtering unit 304, s11 an address signal generated by the address generator 401, s12 a flag inversion signal generated by the address generator 401, and s13 a filtering unit control signal generated by the filtering coefficient changer 404.

The operation of the filtering processor with the above configuration will be described.

This example is a combination of Examples 1 to 5 above, and the basic concept is as described in these examples. Hereinbelow, therefore, only points specific to this example will be described.

The processing covering the input digital signal series s1 through the positional information signal s2 is the same as that described in Example 1. The description thereof is therefore omitted herein. The address generator 401 outputs the address signal s11 based on the positional information signal s2, so as to control the memory 102 so that the memory 102 can output the digital signal series s4 to be subjected to filtering by the filtering unit 304. The address generator 401 also outputs the flag inversion signal s12 indicating whether or not the flag corresponding to the plus/minus of the digital signal series s4 should be inverted. The filter coefficient changer 404 outputs the filtering unit control signal s13 to the filtering unit 304 so as to designate the filter coefficient to be used for the digital signal series s7.

Hereinbelow, the necessity of the filter coefficient change and the flag inversion will be described.

When, for example, horizontal rows of samples are selected from two-dimensional image data one by one and each row is used as the input digital signal series s1, the number of samples included in the respective input digital signal series s1 input into the filtering processor are different from one another. In this case, if a 7-tap filter is used for the filtering of all of the digital signal series s1, there may arise the case where a signal series composed of five samples is subjected to the filtering with the 7-tap filter. In such a case, the transformation efficiency of the filtering reduces. In other words, it is more efficient to perform the filtering for the signal series composed of five samples using a filter with less taps. Accordingly, it is required to change the filter coefficient depending on the number of samples included in the respective input digital signal series.

Also, since the filter coefficient is changed in this example, it becomes necessary to employ the filtering method described in Example 3 for the processing of the start and the end of the input digital signal series. Accordingly, the digital signal series s4 is flag-inverted by the flag inverter 203.

As described above, the filtering processor of this example including the memory 102, the position determinator 103, the address generator 401, the flag inverter 203, the filter coefficient changer 404, and the filtering unit 304 effectively reduces the number of independent data samples after the filtering, as compared with the conventional processors, irrelevant of the type of the filter used.

EXAMPLE 7

An example of the decimation filtering processor where the filtering processors shown in Examples 1 to 6 are used for the compression of a digital signal series such as video signals will be described with reference to FIG. 6.

In this example, a one-dimensional filtering operation will be described. Two-dimensional filtering can be realized by performing two one-dimensional filtering operations; one in the horizontal and one in the vertical directions. Thus, the present invention is applicable to multi-dimensional filtering.

Data is decimated when the filtering is used for the compression of a digital signal series. The decimation filtering processor of this example may be used for a pre-processing of the coding of video signals and the like.

Figure 6:
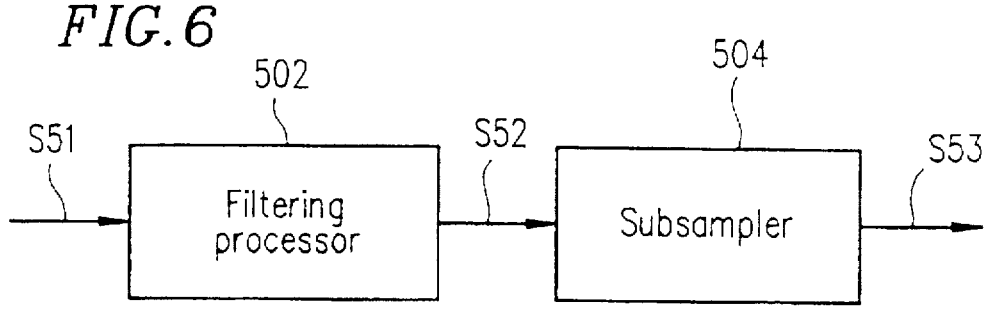
FIG. 6 is a block diagram showing an example of a decimation filtering processor according to the present invention using the filtering processor of any one of the first to fifth examples for compression of a signal series.

FIG. 6 is a block diagram showing the configuration of the decimation filtering processor of this example. The decimation filtering processor includes a filtering processor 502 and a subsampler 504. The reference code s51 denotes an input digital signal series, s52 a digital signal series output from the filtering processor 502, and s53 a filtering signal series decimated by the subsampler 504.

The operation of the decimation filtering processor with the above structure will be described. The filtering processor 502 is, for example, the filtering processor of Example 1 shown in FIG. 1. The filtering processor 502 outputs the filtering signal series s52 after the filtering in a predetermined manner. The subsampler 504 outputs the filtering signal series s53 obtained by decimating the digital signal series s52.

Thus, according to this example, the decimation filtering processor can be realized by disposing the subsampler 504 downstream of the filtering processor 502 which can be any of those shown in Examples 1 to 6. The filtering processor 502 may be one of or a combination of some of the filtering processors of Example 1 to 6.

EXAMPLE 8

An example of the interpolation filtering processor where the filtering processors shown in Examples 1 to 6 are used for the expansion of a digital signal series such as video signals will be described with reference to FIG. 7.

In this example, a one-dimensional filtering operation will be described. Two-dimensional filtering can be realized by performing two one-dimensional filtering operations; one in the horizontal and one in the vertical directions. Thus, the present invention is applicable to multi-dimensional filtering.

Data is decimated when the filtering is used for the compression of a digital signal series. The interpolation filtering processor of this example is used for the interpolation of data samples eliminated by the decimation filtering processor of Example 7 and the filtering of the interpolated signal series.

Figure 7:
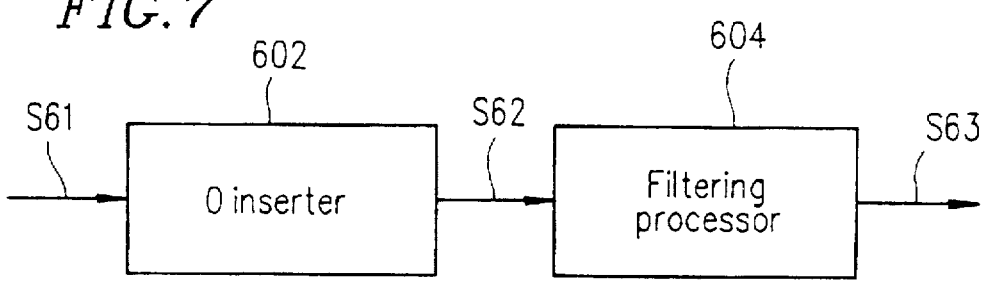
FIG. 7 is a block diagram showing an example of an interpolation filtering processor according to the present invention using one of the filtering processors of the first to fifth examples for expansion of a signal series.
Figure 8:
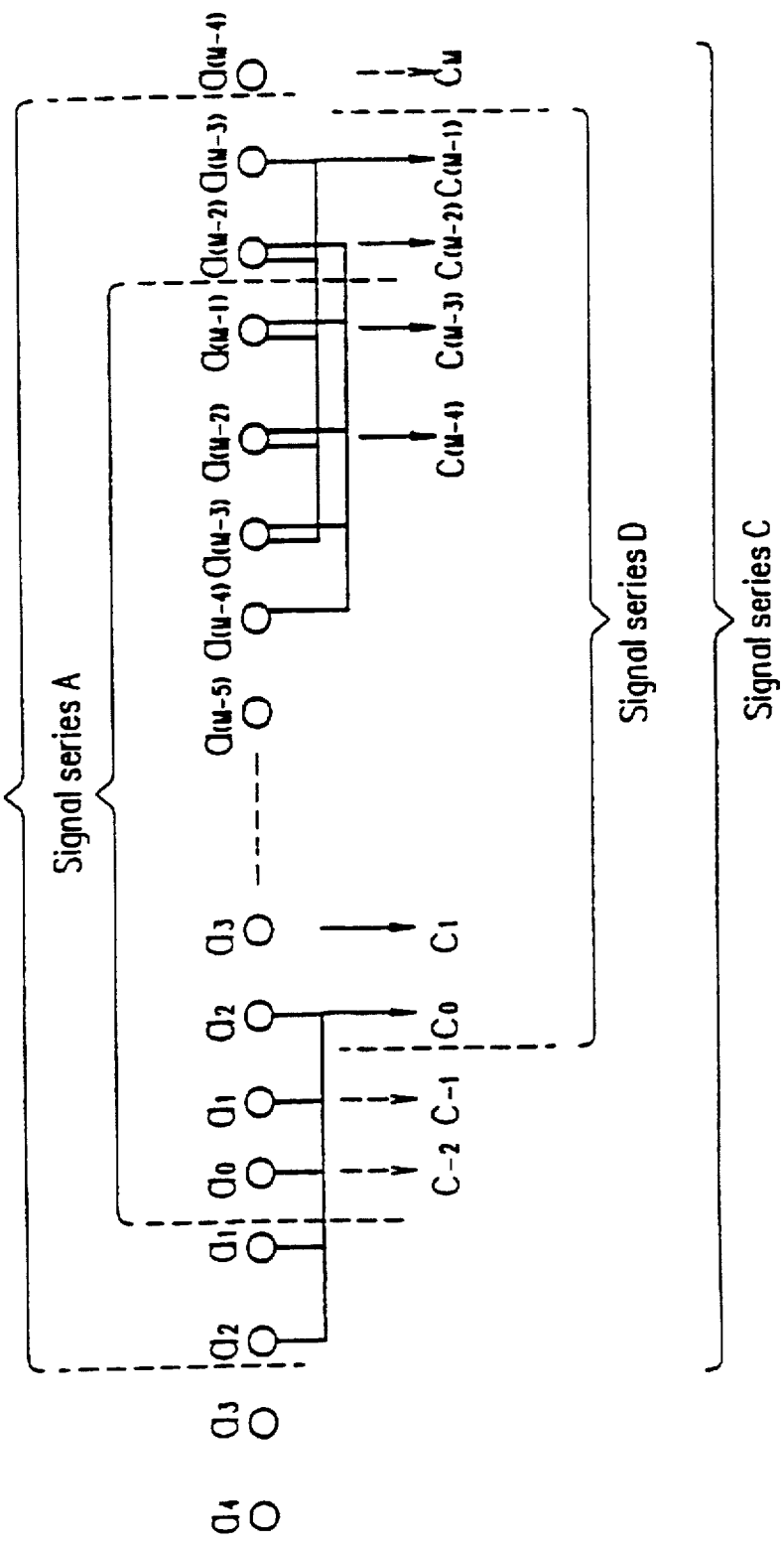
FIGS. 8–10 illustrate the filtering method according to the present invention.
Figure 9:
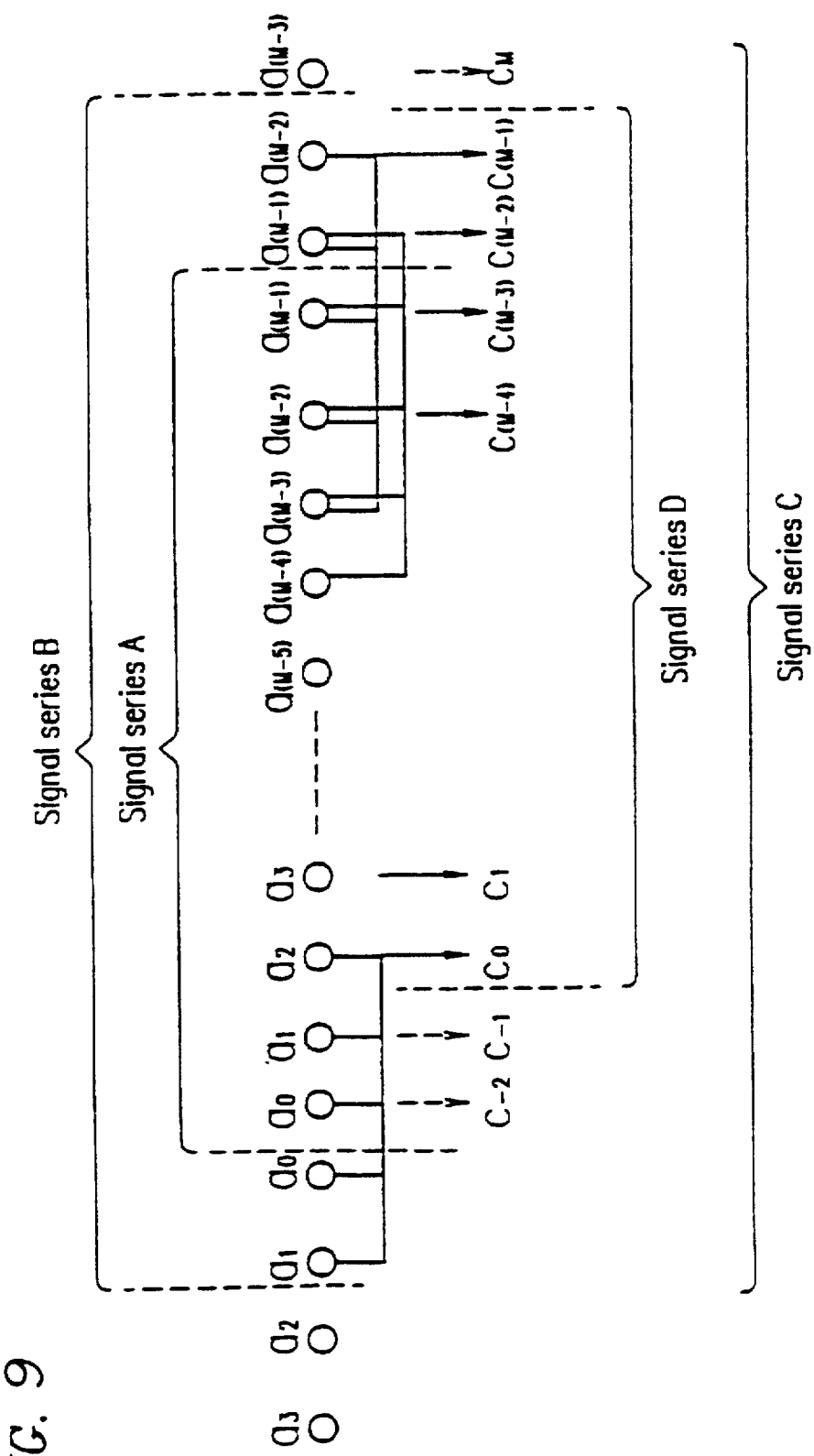

FIG. 7 is a block diagram showing the configuration of the interpolation filtering processor of this example. The interpolation filtering processor includes a 0 inserter 602 and a filtering processor 604. The reference code s61 denotes an input digital signal series, s62 a digital signal series output from the 0 inserter 602, and s63 a filtering signal series output from the filtering processor 604.

The operation of the interpolation filtering processor with the above structure will be described. The 0 inserter 602 interpolates zeros at positions of data samples eliminated by the subsampler 504 shown in FIG. 6 for the input digital signal series s61, and outputs the interpolated digital signal series s62. The filtering processor 604 is, for example, the filtering processor of Example 1 shown in FIG. 1. The filtering processor 604 outputs the filtering signal series s63 after the filtering in a predetermined manner.

Thus, according to this example, the interpolation filtering processor can be realized by disposing the 0 inserter 602 upstream of the filtering processor 604 which can be any of those shown in Examples 1 to 6 capable of reducing the number of data samples. The filtering processor 604 may be one of or a combination of some of the filtering processors of Examples 1 to 6.

Figure 11:
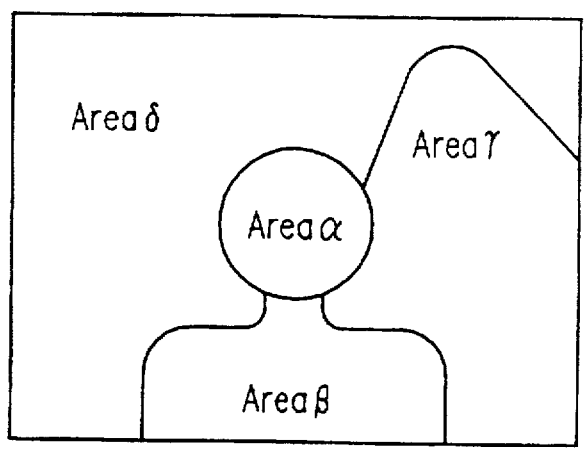
FIG. 11 illustrates area separation.

An example of the area separation is shown in FIG. 11. The image represented by the input digital video signal series s14 is separated into four areas, i.e., an area a (face of a figure), an area b (body of the figure), an area g (background 1), and an area d (background 2). Each area may be represented by a digital video signal series. In the conventional filtering processes, when data representing the boundaries of two areas and the peripheries of the screen are to be restored, additional data samples should be presumed to precede the start of and follow the end of the respective separated digital video signal series in a predetermined manner before the filtering of the signal series. This increases the amount of excessive data required to be transmitted at the data transmission. As the number of separated areas increases, the amount of such excessive data increases, reducing the transmission efficiency. The number of data samples included in a video signal series does not increase by the filtering of the filtering processor. Accordingly, highly efficiency coding can be obtained even when the coding is performed per an area, not per screen, realizing suitable coding for each area.

A subsampler is not necessary when the address generator of the filtering processor generates an address signal in consideration of the decimation. Filtering processors may be connected in series so as to perform the horizontal and vertical filtering operations separately. A filtering processor may be provided for each low and high frequency band. A multiple number of filtering processors may be used for separating a signal series into the multiple number of signal series having different frequency bands. The operation of data not required for reversible filtering is not necessary. An 0 inserter is not necessary when the address generator of the filtering processor generates an address signal in consideration of the interpolation. The value used for the interpolation may not necessarily be zero. A multiple number of filtering processors may be used for merging a multiple number of signal series having different frequency bands. The operation of data not required for reversible filtering is not necessary.

EXAMPLE 9

Examples of the decimation filtering processor and the interpolation filtering processor according to the present invention will be described with reference to FIGS. 12A and 12B. The decimation filtering processor and the interpolation filtering processor of this example uses the filtering processor of Example 1 for the filtering for sub-band coding, i.e., a compression technique for a digital signal series such as video signals.

In this example, a one-dimensional filtering operation will be described. Two-dimensional filtering can be realized by performing two one-dimensional filtering operations; one in the horizontal and one in the vertical direction. Thus, the present invention is applicable to multi-dimensional filtering.

Figure 12A:
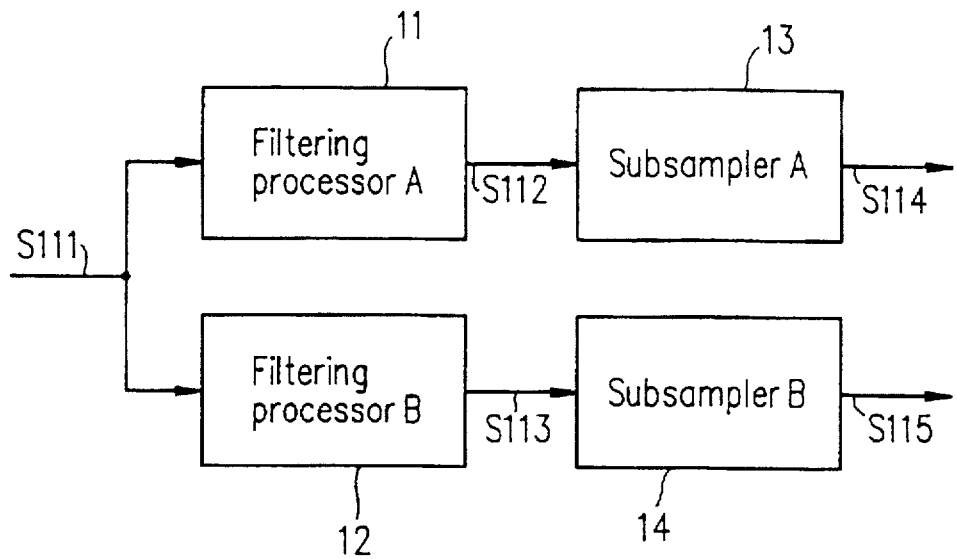
FIG. 12A is a block diagram showing an example of a decimation filtering processor using one or more of the filtering processors of the first to fifth examples for compression of a signal series.

FIG. 12A is a block diagram showing the configuration of the decimation filtering processor of this example. FIG. 12B is a block diagram showing the configuration of the interpolation filtering processor of this example.

The decimation filtering processor includes a filtering processor A 11, a filtering processor B 12, a subsampler A 13, and a subsampler B 14. The reference code sill denotes an input digital video signal series, s112 a filtering signal series output from the filtering processor A 11, s113 a filtering signal series output from the filtering processor B 12, s114 a filtering signal series obtained by the decimation by the subsampler A 13, s115 a filtering signal series obtained by the decimation by the subsampler B 14.

The interpolation filtering processor includes a 0 inserter A 15, a 0 inserter B 16, a filtering processor C 17, a filtering processor D 18, and a merger 19. The reference code s116 denotes an input digital video signal series, S117 an input digital signal series, s118 a digital signal series output from the 0 inserter A 15, S119 a digital signal series output from the 0 inserter B 16, s120 a filtering signal series output from the filtering processor C 17, s121 a filtering signal series output from the filtering processor D 18, and s122 an output of the merger 19.

The operations of the decimation filtering processor and the interpolation filtering processor with the above configurations will be described.

The filtering processor A 11 and the filtering processor B 12 are the filtering processor of Example 1 shown in FIG. 1, for example. Thus, referring to FIG. 12A, the filtering processor A 11 performs the filtering for the input digital signal series s111 by a predetermined filtering method, and outputs the result as the filtering signal series s112. Similarly, the filtering processor B 12 performs the filtering for the input digital signal series s111 by a predetermined filtering method, and outputs the result as the filtering signal series s113. The subsampler A 13 decimates the input filtering signal series s112 and outputs the decimated filtering signal series s114. Similarly, the subsampler B 14 decimates the input filtering signal series s113 and outputs the decimated filtering signal series s115.

Figure 12B:
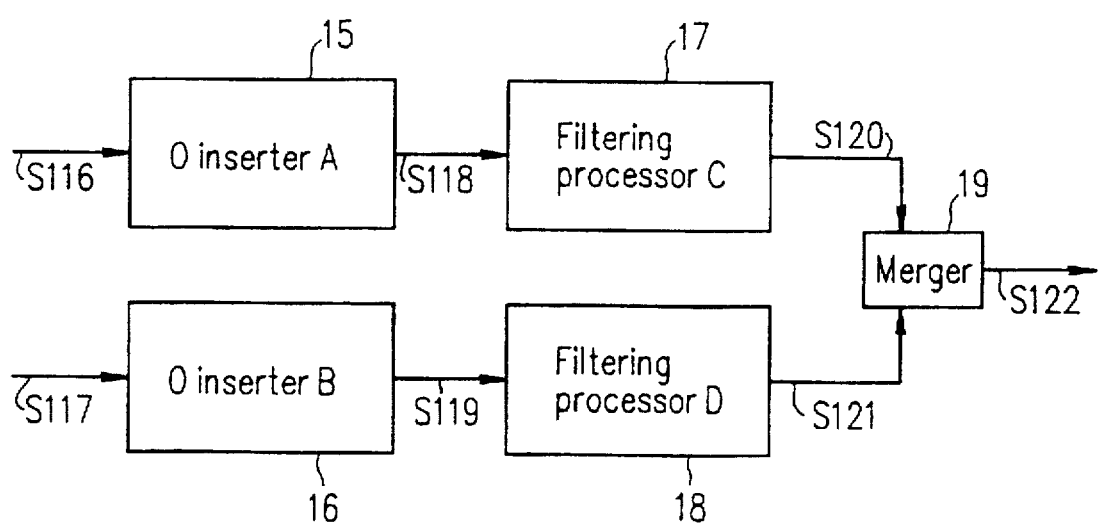
FIG. 12B is a block diagram showing an example of an interpolation filtering processor using one or more of the filtering processors of the first to fifth examples for expansion of a signal series.

Referring to FIG. 12B, the 0 inserter A 15 interpolates zeros at positions of data samples eliminated by the subsampler A 13 shown in FIG. 12A, for the input digital signal series s116 (corresponding to the output s114 of the decimation filtering processor), and outputs the interpolated digital signal series s118. Similarly, the 0 inserter B 16 interpolates zeros at positions of data samples eliminated by the subsampler B 14 shown in FIG. 12A for the input digital signal series s117 (corresponding to the output s115 of the decimation filtering processor), and outputs the interpolated digital signal series S119. The filtering processor C 17 and the filtering processor D 18 are the filtering processor of Example 1, for example. Thus, the filtering processor C 17 performs the filtering for the input digital signal series s118 by a predetermined filtering method, and outputs the result as the filtering signal series s120. Similarly, the filtering processor D 18 performs the filtering for the input digital signal series s119 by a predetermined filtering method, and outputs the result as the filtering signal series s121. The merger 19 calculates an average of data samples at the same position in the filtering signal series s120 and s121, and outputs the result as the digital signal series s122.

Figure 13A:
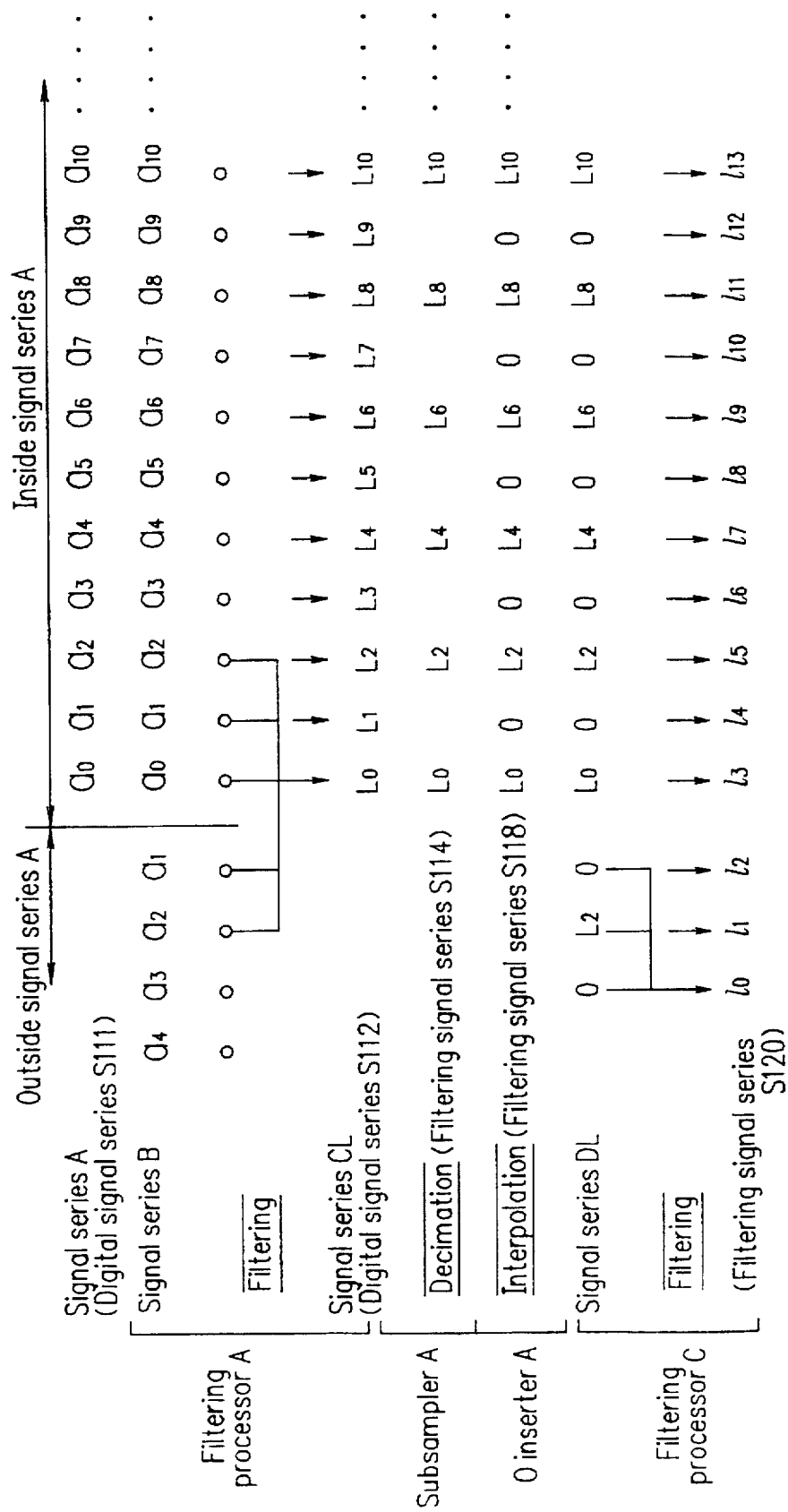
Figure 14A:
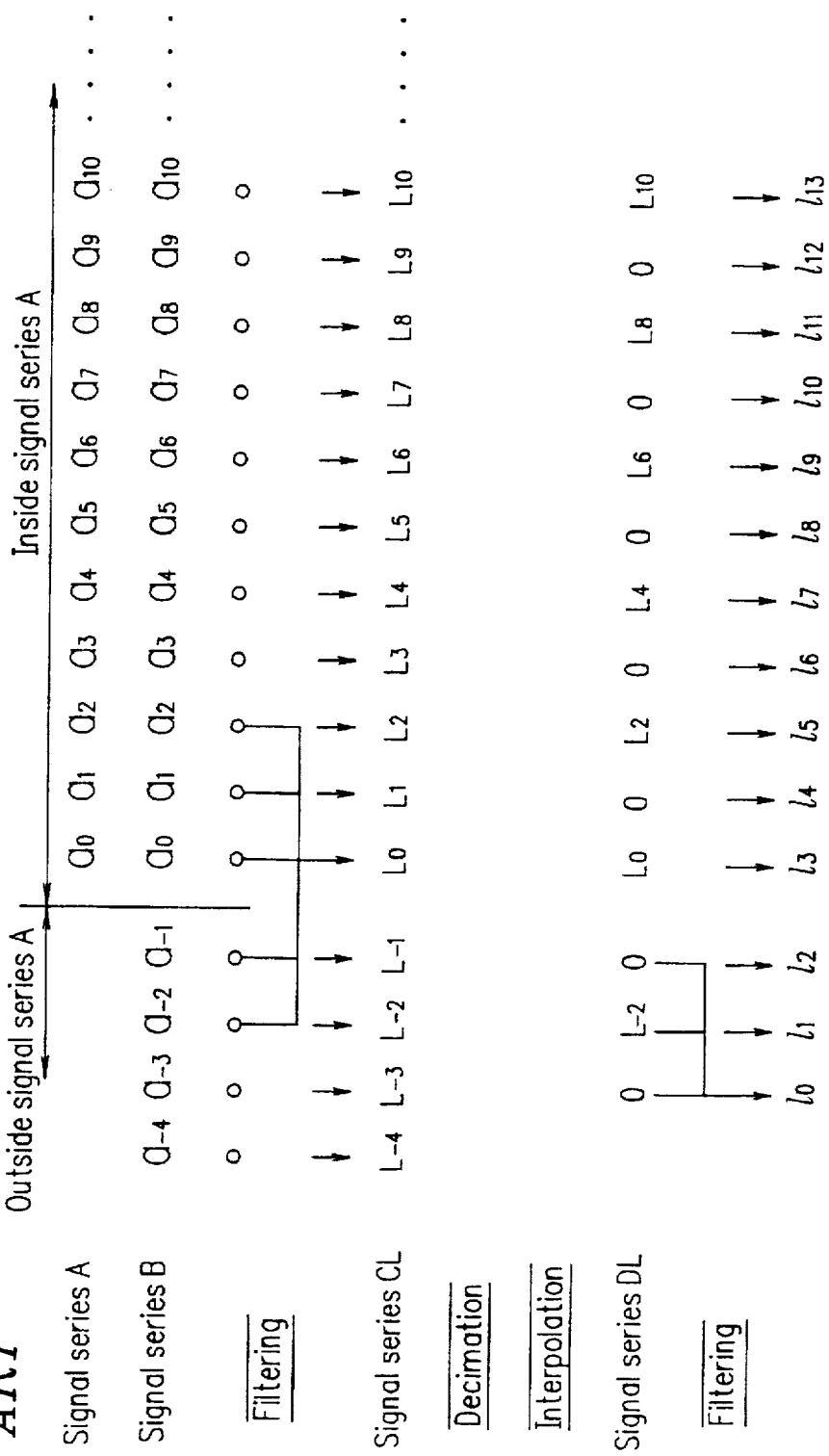

Referring to FIGS. 13A and 13B, the processing method of a digital signal series employed in this example will be described.

A digital signal series $A=\{a_0, a_1, \ldots, a_i, \ldots, a_{(M-1)}\}$ having M data samples (M is an natural number) is used as the input digital signal series s111.

In this example, a 5-tap low-pass filter and a 3-tap high-pass filter are used as the filters for the frequency separation, while a 3-tap low-pass filter and a 5-tap high-pass filter are used as the filters for the frequency merging which is the inverse transformation of the frequency separation. The filter coefficients of the respective filters are shown in Table 1.

First, the processing performed by the decimation filtering processor will be described.

The filtering processor A 11 generates a digital signal series B by presuming data samples to precede the start of and follow the end of the digital signal series A. The generated digital signal series B is subjected to filtering by use of the 5-tap low-pass filter for the frequency separation. A data sample $L_i$ of a signal series CL output from the filtering processor A 11 is obtained by calculating equation (1) below using five data samples $\{a_{(i-2)}, a_{(i-1)}, a_i, a_{(i+1)}, a_{(i+2)}\}$ of the signal series B.

$$L_i = Ld0 \times a_{(i-2)} + Ld1 \times a_{(i-1)} + Ld2 \times a_i + Ld3 \times a_{(i+1)} + Ld4 \times a_{(i+2)} \quad (1)$$

Similarly, the filtering processor B 12 generates the digital signal series B by presuming data samples to precede the start of and follow the end of the digital signal series A. The generated digital signal series B is subjected to filtering by use of the 3-tap high-pass filter for the frequency separation.

A data sample Hi of a signal series CH output from the filtering processor B 12 is obtained by calculating equation (2) below using three data samples $\{a_i, a_{(i+1)}, a_{(i+2)}\}$ of the digital signal series B.

$$H_i = Hd2 \times a_i + Hd3 \times a_{(i+1)} + Hd4 \times a_{(i+2)} \quad (2)$$

The subsampler A 13 decimates the signal series CL by eliminating data samples therein in the odd numbers. In other words, only data samples in the even numbers are output as the filtering signal series s114, which is composed of data samples $\{L_0, L_2, L_4, \ldots\}$.

Similarly, the subsampler B 14 decimates the signal series CH by eliminating data samples therein in the odd numbers. In other words, only data samples in the even numbers are output as the filtering signal series s115, which is composed of data samples $\{H_0, H_2, H_4, \ldots\}$.

Then, the processing performed by the interpolation filtering processor will be described. The 0 inserter A 15 interpolates zeros at positions of eliminated data samples for the filtering signal series s116, and outputs the interpolated filtering signal series s118. As shown in FIG. 13A, the filtering processor C 17 presumes data samples to precede the start of and follow the end of the filtering signal series s118 by using data samples included in the filtering signal series s118, so as to generate a signal series DL. The filtering processor C 17 then performs the filtering for the generated signal series DL by use of the low-pass filter. A data sample $l_i$ of the filtering signal series s120 output from the filtering processor C 17 is obtained by calculating equation (3) below by use of the signal series DL.

$$l_i = Ls2 \times L_{(i-3)} + Ls3 \times L_{(i-2)} + Ls4 \times L_{(i-1)} \quad (3)$$

Similarly, the 0 inserter B 16 interpolates zeros at positions of eliminated data samples for the filtering signal series s117, and outputs the interpolated filtering signal series S119. As shown in FIG. 13B the filtering processor D 18 presumes data samples to precede the start of and follow the end of the filtering signal series s119 by using data samples included in the filtering signal series s119, so as to generate a signal series DH. The filtering processor D 18 then performs the filtering for the generated signal series DH by use of the low-pass filter. A data sample $h_i$ of the filtering signal series s121 output from the filtering processor D 18 is obtained by calculating equation (4) below by use of the signal series DH.

$$h_i = Hs0 \times H_{(i-3)} + Hs1 \times H_{(i-2)} + Hs2 \times H_{(i-1)} + Hs3 \times H_i + Hs4 \times H_{(i+1)} \quad (4)$$

Then, $a'_i$ (the digital signal series s122) is obtained by the merger 19 by equation (5):

$$a'_i = (l_i 30\ h_i)/2 \quad (5)$$

where $a'_i = a_i$.

As a result, the digital signal series A can be correctly restored.

As described above, in this example, the filtering processor of the present invention can be used for the sub-band coding by the combined use of the decimation filtering processor of Example 7 and the interpolation filtering processor of Example 8. The filtering processor A 13, the filtering processor B 14, the filtering processor C 15, and the filtering processor D 16 may also be any one of or a combination of some of the filtering processors of Examples 2 to 4.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A filtering processor, comprising:

computer implemented transformation means for transforming a first signal series $\{a_0, a_1, \ldots, a_i, \ldots, a_{(M-1)}\}$ having M signals (M is a natural number into a second signal series $\{b_{-K}, \ldots, b_{-1}, b_0, b_1, \ldots, b_{M-1}, b_{M'}, \ldots, b_{M+K-1}\}$ having (M+2K) signals; and an N-tap filter (N is a natural number and N≦M) for filtering the second signal series, wherein the transformation means transforms the first signal series into the second signal series based on equations:

$b_i = a_{-i}$ (when $-K \leq i < 0$)

$b_i = a_i$ (when $0 \leq i < M$)

$b_i = a_{2M-i-2}$ (when $M \leq i \leq M+K-1$)

where i is an integer, and K is a natural number; K=N/2 when N is an even number, and K=(N−1)/2 when N is an odd number.

2. A filtering processor according to claim 1, wherein the transformation means includes:

memory means for storing the first signal series input thereinto;

position determination means for determining the position of a next signal in the second signal series, the next signal being output sequentially from the memory means; and address generation means for generating an address of the next signal in the memory means, so as to output the address to the memory means.

3. A filtering processor according to claim 1, further comprising determination means for determining the number of taps and filter coefficients of the filter so that the number of taps of the filter is smaller than the number of signals included in the first signal series.

4. A filtering processor according to claim 1, further comprising filter coefficient flag inversion means for inverting a flag of a filter coefficient of the filter in accordance with a predetermined rule.

5. A filtering processor according to claim 4, further comprising determination means for determining the number of taps and the filter coefficient of the filter so that the number of taps of the filter is smaller than the number of signals included in the first signal series.

6. A filtering processor according to claim 4, further comprising determination means for determining the number of taps and the filter coefficient of the filter depending on the first signal series.

7. A filtering processor according to claim 1, further comprising flag inversion means for inverting a flag of a data sample of the second signal series in accordance with a predetermined rule.

8. A filtering processor according to claim 7, further comprising determination means for determining the number of taps and filter coefficients of the filter depending on the first signal series.

9. A filtering processor according to claim 7, further comprising determination means for determining the number of taps and filter coefficients of the filter so that the number of taps of the filter is smaller than the number of signals included in the first signal series.

10. A filtering processor according to claim 1, further comprising determination means for determining the number of taps and filter coefficients of the filter depending on the first signal series.

11. A filtering processor, comprising:

computer implemented transformation means for transforming a first signal series $\{a_0, a_1, \ldots, a_i, \ldots, a_{(M-1)}\}$ having M signals (M is a natural number into a second signal series $\{b_{-K}, \ldots, b_{-1}, b_0, b_1, \ldots, b_{M-1}, b_{M'}, \ldots, b_{M+K-1}\}$ having (M+2K) signals; and an N-tap filter (N is a natural number and N≦M) for filtering the second signal series, wherein the transformation means transforms the first signal series into the second signal series based on equations:

$b_i = a_{-i-1}$ (when $-K \leq i < 0$)

$b_i = a_i$ (when $0 \leq i < M$)

$b_i = a_{2M-i-1}$ (when $M \leq i \leq M+K-1$)

where i is an integer, and K is a natural number; K=N/2 when N is an even number, and K=(N−1)/2 when N is an odd number.

12. A filtering processor according to claim 2, wherein the transformation means includes:

memory means for storing the first signal series input thereinto;

position determination means for determining the position of a next signal in the second signal series, the next signal being output sequentially from the memory means; and address generation means for generating an address of the next signal in the memory means, so as to output the address to the memory means.

13. A filtering processor according to claim 11, further comprising determination means for determining the number of taps and filter coefficients of the filter so that the number of taps of the filter is smaller than the number of signals included in the first signal series.

14. A filtering processor according to claim 11, further comprising filter coefficient flag inversion means for inverting a flag of a filter coefficient of the filter in accordance with a predetermined rule.

15. A filtering processor according to claim 14, further comprising determination means for determining the number of taps and the filter coefficient of the filter so that the number of taps of the filter is smaller than the number of signals included in the first signal series.

16. A filtering processor according to claim 14, further comprising determination means for determining the number of taps and the filter coefficient of the filter depending on the first signal series.

17. A filtering processor according to claim 11, further comprising flag inversion means for inverting a flag of a data sample of the second signal series in accordance with a predetermined rule.

18. A filtering processor according to claim 17, further comprising determination means for determining the number of taps and filter coefficients of the filter depending on the first signal series.

19. A filtering processor according to claim 17, further comprising determination means for determining the number of taps and filter coefficients of the filter so that the number of taps of the filter is smaller than the number of signals included in the first signal series.

20. A filtering processor according to claim 11, further comprising determination means for determining the number of taps and filter coefficients of the filter depending on the first signal series.

21. A filtering processor, comprising:

computer implemented transformation means for transforming a first signal series $\{a_0, a_1, \ldots, a_i, \ldots, a_{(M-1)}\}$ having M signals (M is a natural number into a second signal series $\{b_{-K}, \ldots, b_{-1}, b_0, b_1, \ldots, b_{M-1}, b_M, \ldots, b_{M+K-1}\}$ having (M+2K) signals; and an N-tap filter (N is a natural number and $N \leq M$) for filtering the second signal series, wherein the transformation means transforms the first signal series into the second signal series based on equations:

$b_i = -a_{-i-1}$ (when $-K \leq i < 0$)

$b_i = a_i$ (when $0 \leq i < M$)

$b_i = -a_{2M-i-1}$ (when $M \leq i \leq M+K-1$)

where i is an integer, and K is a natural number; K=N/2 when N is an even number, and K=(N−1)/2 when N is an odd number.

22. A filtering processor according to claim 21, wherein the transformation means includes:

memory means for storing the first signal series input thereinto;

position determination means for determining the position of a next signal in the second signal series, the next signal being output sequentially from the memory means;

address generation means for generating an address of the next signal in the memory means so as to output the address to the memory means, and for outputting a flat inversion signal indicating whether or not the flag of the next signal should be inverted; and flag inversion means for inverting the flag of the next signal output from the memory means based on the flag inversion signal.

23. A filtering processor according to claim 21, further comprising determination means for determining the number of taps and filter coefficients of the filter so that the number of taps of the filter is smaller than the number of signals included in the first signal series.

24. A filtering processor according to claim 21, further comprising determination means for determining the number of taps and filter coefficients of the filter depending on the first signal series.

25. A filtering processor, comprising:

computer implemented means for transforming a first signal series having $M_1$ signals ($M_1$ is a natural number) into a second signal series having $M_2$ signals ($M_2$ is a natural number); and an N-tap filter for filtering the second signal series to generate a third signal series having $M_3$ signals ($M_3$ is a natural number), wherein the second signal series is composed of the first signal series and signals of a predetermined value added to precede the start and follow the end thereof, and $M_1$ signals among the $M_3$ signals included in the third signal series are independent from any other signals.

26. A filtering method, comprising the steps of:

using the computer to transform a first signal series $\{a_0, a_1, \ldots, a_i, \ldots, a_{(M-1)}\}$ having M signals (M is a natural number) into a second signal series $\{b_{-K}, \ldots, b_{-1}, b_0, b_1, \ldots, b_{M-1}, b_M, \ldots, b_{M+K-1}\}$ having (M+2K) signals said transformation of the first signal series into the second signal series being based on equations:

$b_i = a_{-i-1}$ (when $-K \leq i < 0$)

$b_i = a_i$ (when $0 \leq i < M$)

$b_i = a_{2M-i-1}$ (when $M \leq i \leq M+K-1$)

where i is an integer, and K is a natural number; K=N/2 when N is an even natural number, and K=(N−1)/2 when N is an odd natural number; and using an N-tap filter (N is a natural number and $N \leq M$) to filter the second signal series.

27. A filtering method according to claim 26, further comprising the step of determining the number of taps and filter coefficients of the filter so that the number of taps of the filter is smaller than the number of signals included in the first signal series.

28. A filtering method according to claim 26, further comprising the step of inverting a flag of a filter coefficient of the filter in accordance with a predetermined rule.

29. A filtering method according to claim 28, further comprising the step of determining the number of taps and the filter coefficients of the filter so that the number of taps of the filter is smaller than the number of signals included in the first signal series.

30. A filtering method according to claim 28, further comprising the step of determining the number of taps and the filter coefficients of the filter depending on the first signal series.

31. A filtering method according to claim 26, further comprising the step of inverting a flag of a data sample of the second signal series in accordance with a predetermined rule.

32. A filtering method according to claim 31, further comprising the step of determining the number of taps and the filter coefficients of the filter depending on the first signal series.

33. A filtering method according to claim 31, further comprising the step of determining the number of taps and the filter coefficients of the filter so that the number of taps of the filter is smaller than the number of signals included in the first signal series.

34. A filtering method according to claim 26, further comprising the step of determining the number of taps and filter coefficients of the filter depending on the first signal series.

35. A filtering method, comprising the steps of:

using the computer to transform a first signal series $\{a_0, \ldots, a_1, \ldots, a_{(M-1)}\}$ having M signals (M is a natural number) into a second signal series $\{b_{-K}, \ldots, b_{-1}, b_0, b_1, \ldots, b_{M-1}, b_M, \ldots, b_{M+K-1}\}$ having (M+2K) signals said transformation of the first signal series into the second signal series being based on equations:

$b_i = a_{-i-1}$ (when $-K \leq i < 0$)

$b_i = a_i$ (when $0 \leq i < M$)

$b_i = a_{2M-i-1}$ (when $M \leq i \leq M+K-1$)

where i is an integer, and K is a natural number; K=N/2 when N is an even number, and K=(N−1)/2 when N is an odd number; and using an N-tap filter (N is a natural number and $N \leq M$) to filter the second signal series.

36. A filtering method according to claim 35, further comprising the step of determining the number of taps and filter coefficients of the filter so that the number of taps of the filter is smaller than the number of signals included in the first signal series.

37. A filtering method according to claim 35, further comprising the step of inverting a flag of a filter coefficient of the filter in accordance with a predetermined rule.

38. A filtering method according to claim 37, further comprising the step of determining the number of taps and the filter coefficients of the filter so that the number of taps of the filter is smaller than the number of signals included in the first signal series.

39. A filtering method according to claim 37, further comprising the step of determining the number of taps and the filter coefficients of the filter depending on the first signal series.

40. A filtering method according to claim 25, further comprising the step of inverting a flag of a data sample of the second signal series in accordance with a predetermined rule.

41. A filtering method according to claim 40, further comprising the step of determining the number of taps and filter coefficients of the filter depending on the first signal series.

42. A filtering method according to claim 40, further comprising the step of determining the number of taps and filter coefficients of the filter so that the number of taps of the filter is smaller than the number of signals included in the first signal series.

43. A filter method according to claim 35, further comprising the step of determining the number of taps and filter coefficients of the filter depending on the first signal series.

44. A filtering method, comprising the steps of:

using the computer to transform a first signal series $\{a_0, a_1, \ldots, a_i, \ldots, a_{(M-1)}\}$ having M signals (M is a natural number) into a second signal series $\{b_{-K}, \ldots, b_{-1}, b_0, b_1, \ldots, b_{M-1}, b_M, \ldots, b_{M+K-1}\}$ having (M+2K) signals, said transformation of the first signal series into the second signal series being based on equations:

$$b_i = -a_{-i-1} \text{ (when } -K \leq i < 0\text{)}$$

$$b_i = a_i \text{ (when } 0 \leq i < M\text{)}$$

$$b_i = -a_{2M-i-1} \text{ (when } M \leq i \leq M+K-1\text{)}$$

where i is an integer, and K is a natural number; K=N/2 when N is an even natural number, and K=(N−1)/2 when N is an odd number; and using an N-tap filter (N is a natural number and N≦M) to filter the second signal series.

45. A filtering method according to claim 44, further comprising the step of determining the number of taps and filter coefficients of the filter so that the number of taps of the filter is smaller than the number of signals included in the first signal series.

46. A filtering method according to claim 44, further comprising the step of determining the number of taps and filter coefficients of the filter depending on the first signal series.

\* \* \* \* \*

UNITED STATES PATENT AND TRADEMARK OFFICE
CERTIFICATE OF CORRECTION

PATENT NO. : 5,777,900
DATED : July 7, 1998
INVENTOR(S) : Seiichi Takeuchi and Shinya Kadono It is certified that error appears in the above-identified patent and that said Letters Patent is hereby corrected as shown below:

At column 22, claim 12, line 26, "2" should read --11--.

At column 25, claim 40, line 18, "25" should read --35--.

Signed and Sealed this

Fifth Day of January, 1999

*Attest:*

*Attesting Officer*  *Acting Commissioner of Patents and Trademarks*